US010663291B2

(12) United States Patent
Morrison et al.

(10) Patent No.: US 10,663,291 B2
(45) Date of Patent: May 26, 2020

(54) METHOD AND SYSTEM FOR REPRODUCING VISUAL CONTENT

(71) Applicant: CANON KABUSHIKI KAISHA, Tokyo (JP)

(72) Inventors: Paul William Morrison, Erskine Park (AU); Ben Yip, Ryde (AU); Cameron Murray Edwards, Clovelly (AU); Eric Wai Shing Chong, Carlingford (AU)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/814,291

(22) Filed: Nov. 15, 2017

(65) Prior Publication Data
US 2018/0143008 A1    May 24, 2018

(30) Foreign Application Priority Data
Nov. 18, 2016 (AU) ................................. 2016259442

(51) Int. Cl.
*G06K 9/36* (2006.01)
*G01B 11/25* (2006.01)
(Continued)

(52) U.S. Cl.
CPC ...... *G01B 11/2513* (2013.01); *G01B 11/2441* (2013.01); *G01B 11/2504* (2013.01);
(Continued)

(58) Field of Classification Search
CPC ............ G01B 11/2513; G01B 11/2441; H01L 23/535; H01L 27/11519; H01L 29/0688; H04N 5/247
See application file for complete search history.

(56) References Cited

U.S. PATENT DOCUMENTS

| | | |
|---|---|---|
| 6,282,300 B1 | 8/2001 | Bloom et al. |
| 7,027,634 B2 | 4/2006 | Odell |

(Continued)

FOREIGN PATENT DOCUMENTS

WO    2007043036 A1    4/2007

OTHER PUBLICATIONS

Sagawa, R., Kawasaki, H., Kiyota, S., Furukawa, R.. Dense one-shot 3D reconstruction by detecting continuous regions with parallel line projection. In Computer Vision (ICCV), 2011 IEEE International Conference on, IEEE: Nov. 2011; p. 1911-1918.

(Continued)

*Primary Examiner* — Amir Alavi
(74) *Attorney, Agent, or Firm* — Canon U.S.A., Inc. IP Division

(57) ABSTRACT

A computer-implemented system and method of reproducing visual content are described. The method comprises capturing a reference image of a calibration pattern projected on a surface at an initial position and at an offset position, the offset position relating to a projection offset from the initial position by shifting the calibration pattern a predetermined amount; and determining, using the reference image, a spatial capture offset for the calibration pattern between the initial position and the offset position, the spatial capture offset measuring a spatial shift of the calibration pattern in the reference image. The method further comprises determining a scale using the spatial capture offset and the projection offset; decoding a portion of a captured image, the captured image including the visual content and the calibration pattern, to determine a position within the calibration pattern by applying the determined scale, and reproducing the visual content based on the determined position.

21 Claims, 23 Drawing Sheets

(51) Int. Cl.
  *H04N 9/31*       (2006.01)
  *H04N 5/247*      (2006.01)
  *G01B 11/24*      (2006.01)
  *H01L 23/535*     (2006.01)
  *H01L 27/11519*   (2017.01)
  *H04N 13/254*     (2018.01)
  *H01L 29/06*      (2006.01)

(52) U.S. Cl.
  CPC ...... *H01L 23/535* (2013.01); *H01L 27/11519* (2013.01); *H04N 5/247* (2013.01); *H04N 9/3147* (2013.01); *H04N 9/3185* (2013.01); *H04N 9/3194* (2013.01); *G06T 2207/10012* (2013.01); *G06T 2207/20056* (2013.01); *H01L 29/0688* (2013.01); *H04N 13/254* (2018.05)

(56) References Cited

U.S. PATENT DOCUMENTS

| | | | |
|---|---|---|---|
| 8,150,142 B2 | 4/2012 | Freedman | |
| 8,493,496 B2 | 7/2013 | Freedman et al. | |
| 8,520,060 B2* | 8/2013 | Zomet | G03B 25/02 |
| | | | 348/51 |
| 8,649,025 B2 | 2/2014 | Teodorescu | |
| 8,994,744 B2* | 3/2015 | Sterling | H04N 1/6058 |
| | | | 345/600 |
| 9,052,575 B2* | 6/2015 | Chang | G03B 21/00 |
| 9,329,716 B2* | 5/2016 | Parham | G06F 3/0304 |
| 9,628,723 B2* | 4/2017 | Yu | A61B 6/032 |
| 9,916,524 B2* | 3/2018 | Fanello | G06K 9/627 |
| 2013/0010013 A1* | 1/2013 | Li | G03B 21/56 |
| | | | 345/690 |
| 2017/0318271 A1* | 11/2017 | Sourani | H04N 9/3194 |
| 2018/0143008 A1* | 5/2018 | Morrison | H04N 5/247 |
| 2018/0152697 A1* | 5/2018 | DeVaul | H04N 13/327 |
| 2019/0037184 A1* | 1/2019 | Gauba | H04N 9/3179 |

OTHER PUBLICATIONS

Jason Geng, "Structured-light 3D surface imaging: a tutorial," Adv. Opt. Photon. 3, 128-160 (2011).

Zhang et al 2002 Rapid shape acquisition using color structured light and multi-pass dynamic programming.

Ulusoy 2009 One-shot scanning using De Bruijn spaced grids.

Payeur 2009 Structured Light Stereoscopic Imaging with Dynamic Pseudo-random Patterns.

U. Wijenayake, S.-H. Baek and S.-Y. Park 2013, An Error Correcting 3D Scanning Technique Using Dual Pseudorandom Arrays, 2012 Second Joint 3DIM/3DPVT Conference: 3D Imaging, Modeling, Processing, Visualization & Transmission.

F. Devernay, O. Bantiche and Ève Coste-Manière 2002 Structured Light on Dynamic Scenes using standard stereoscopy algorithms.

R. Morano, C. Ozturk, R. Conn, S. Dubin, S. Zietz and J. Nissano 1998 Structured light using pseudorandom codes, IEEE Transactions on Pattern Analysis and Machine Intelligence, 20(3), pp. 322-327.

* cited by examiner

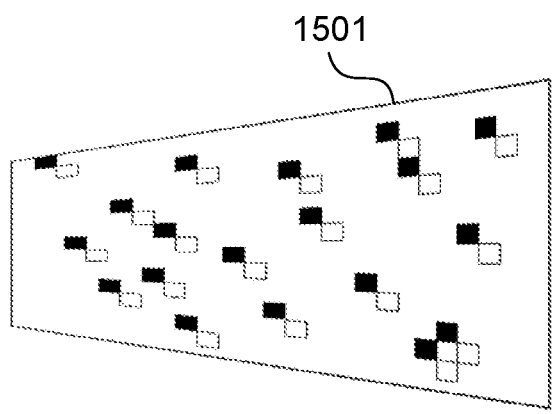
Fig. 15A(1)
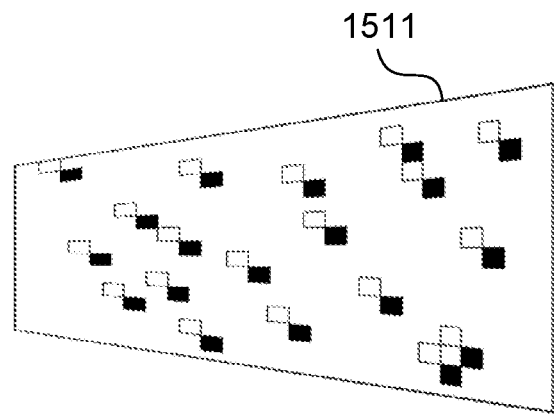
Fig. 15A(2)
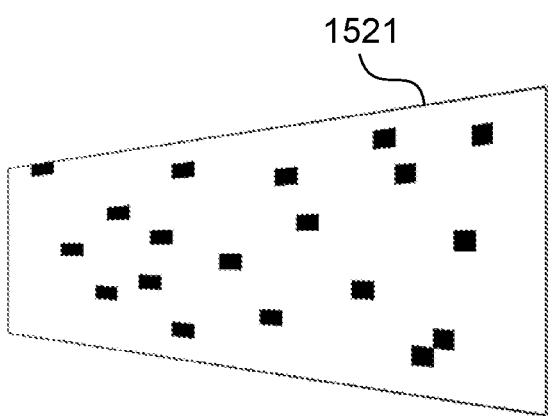
Fig. 15B(1)
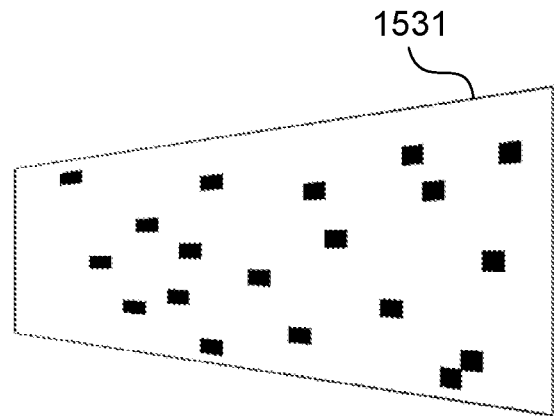
Fig. 15B(2)

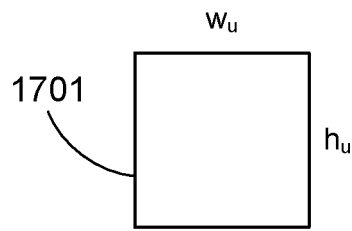
Fig. 17A(1)
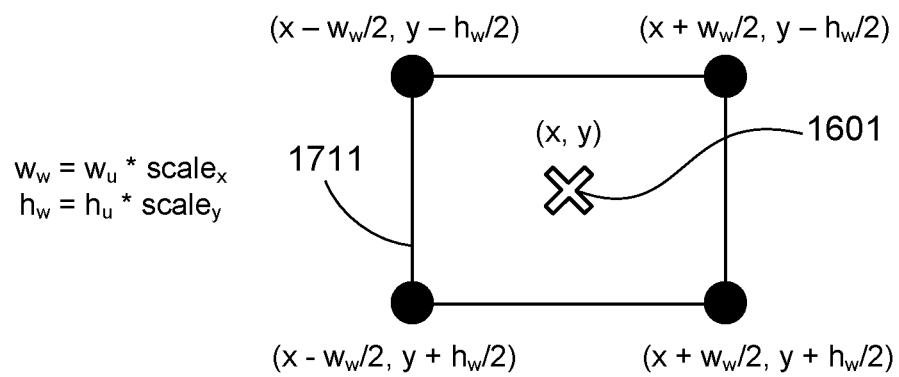
Fig. 17A(2)
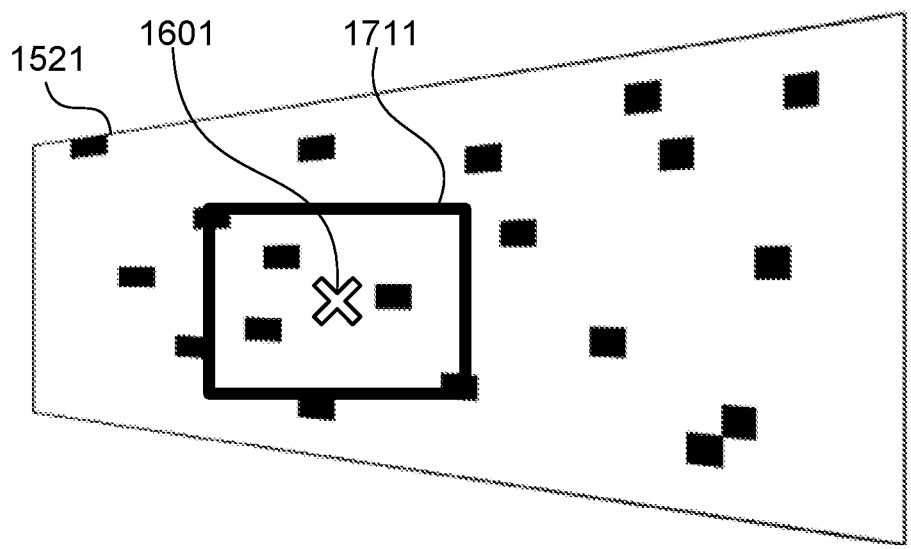
Fig. 17B

$w_{w1} = w_u * scale_{x1}$
$h_{w1} = h_u * scale_{y1}$ $w_{w2} = w_u * scale_{x2}$
$h_{w2} = h_u * scale_{y2}$ $w_{w3} = w_u * scale_{x3}$
$h_{w3} = h_u * scale_{y3}$ $w_{w4} = w_u * scale_{x4}$
$h_{w4} = h_u * scale_{y4}$

METHOD AND SYSTEM FOR REPRODUCING VISUAL CONTENT

CROSS-REFERENCE TO RELATED APPLICATIONS

This U.S. patent application claims the benefit of Australian Patent Application No. 2016259442 filed Nov. 18, 2016, of which is hereby incorporated by reference herein in its entirety.

TECHNICAL FIELD

The present invention relates generally to the field of reproducing visual content and, in particular, to a method, apparatus and system for reproducing visual content, for example using a multi-projector system. The present invention also relates to a computer program product including a computer readable medium having recorded thereon a computer program for reproducing visual content.

BACKGROUND

Projectors are widely-used display devices that can be used to reproduce visual content such as an image, text and the like on many surface types. Multiple projectors are commonly used to increase the size of a projection on a projection surface whilst retaining high resolution and brightness. For example, four projectors can be arranged in a grid configuration to reproduce a single image that is four times larger than the image reproduced by a single projector.

A problem of such multi-projector systems is geometric alignment of the projected images on the projection surface. It is important that a viewer perceives a single image that has no visible seams or brightness fluctuations. Precise alignment of the projected images is therefore important. Many current multi-projection systems require a significant amount of manual effort to perform alignment. Some existing multi-projection systems perform an automatic alignment procedure at system installation time, for example using projected calibration patterns or structured light patterns. A calibration pattern is a projected pattern of intensity values that, perhaps in combination with other calibration patterns, encodes positions within the projected image. However, multi-projector systems may fall out of alignment over time, for example, due to physical movement of a projector or surface, building vibration, or heat fluctuations causing small movement of a projector's internal components. When such systems become misaligned, the manual or automatic alignment procedure typically needs to be re-run.

A calibration pattern or structured light pattern typically "encodes" positions in the projector image panel. At a position in a captured image, the structured light pattern can be "decoded", to identify the corresponding encoded position in the projected image. The decoding process is typically repeated at several positions in the captured image, thereby forming several correspondences between points in the camera image and points in the projector image. The correspondences can then be triangulated, to locate 3D points on the projection surface. Triangulation is a method well-known in the art. Once a representation of the surface is known, the projected images can be aligned.

Many forms of projected calibration patterns or structured light patterns are known. Structured light patterns can be placed in one of two broad categories: temporal patterns and spatial patterns. Spatial calibration patterns typically encode projector position in a spatial region of the projected image. Typically, only a small number of projected images is required, making spatial patterns applicable to dynamic scenes (e.g. when a projection surface is moving). Several spatial calibration patterns consist of a grid of lines or squares. To decode the spatial calibration patterns, the encoding elements (e.g. lines, squares, edges) must typically be extracted from the captured image, and be used to re-construct the projected grid. The methods have a disadvantage of allowing correspondences to be formed at discrete locations only, corresponding to the positions of the projected lines or squares, which limits the number and spatial resolution of correspondences.

Other spatial calibration patterns consist of pseudo-random dot patterns. Pseudo-random dot patterns typically guarantee that a spatial window within the projected pattern is unique. Typically, a spatial region of the captured image is extracted, and is correlated with the projected calibration pattern. The position that has the highest correlation is identified as being the projector position that corresponds with the captured image position. Other pseudo-random dot patterns are created by tiling two or more tiles with different sizes throughout the projected image. Each tile contains a fixed set of pseudo-random dots. A position with a captured image is decoded by correlating a region of the captured image with each of the tiles. Based on the positions of the highest correlations, the absolute position in the projected image can be determined.

Spatial calibration patterns consisting pseudo-random dot patterns have advantages of (1) allowing a dense and continuous set of correspondences to be formed, (2) using simple and fast correlation techniques (e.g. based on the Discrete Fourier Transform), and (3) consisting of a sparse set of pseudo-random dots that can be easily and imperceptibly embedded within a projected image. However, correlation techniques typically require the captured calibration pattern to have a minimal amount of warping, in comparison with the projected calibration pattern. Some existing methods ensure that the captured image is not significantly warped, by placing the camera at a known, fixed and small distance from the projector. Methods requiring placement of the camera at a known fixed distance from the projector cannot easily be used in a multi-projector environment, where the projectors (and therefore the cameras) can be moved to a variety of disparate locations. Other existing methods project line patterns in addition to the pseudo-random dot pattern. The line patterns are used to determine the un-warping required to decode the pseudo-random dot pattern. However, the addition of a line pattern increases the visibility of the calibration pattern, which is undesirable in a projection environment.

There is a need in the art to address one or more of the disadvantages of the methods described above.

SUMMARY

It is an objection of the present invention to substantially overcome, or at least ameliorate, at least one disadvantage of present arrangements.

A first aspect of the present disclosure provides a computer-implemented method of reproducing visual content, the method comprising: capturing a reference image of a calibration pattern projected on a surface at an initial position and at an offset position, the offset position relating to a projection offset from the initial position by shifting the calibration pattern a predetermined amount; determining, using the reference image, a spatial capture offset for the calibration pattern between the initial position and the offset position, the spatial capture offset measuring a spatial shift of the calibration pattern in the reference image; determining a scale using the spatial capture offset and the projection offset; decoding a portion of a captured image, the captured image including the visual content and the calibration pattern, to determine a position within the calibration pattern by applying the determined scale, and reproducing the visual content based on the determined position.

According to another aspect, reproducing the visual content comprises aligning projection of a plurality of projectors.

According to another aspect, the captured image is the reference image.

According to another aspect, the captured image is a different image to the reference image.

According to another aspect, the decoding comprises the steps of: applying the determined scale to a portion of the captured image to de-warp the portion of the image; and decoding the de-warped portion of the captured image to determine the position within the calibration pattern.

According to another aspect, the decoding comprises applying the determined scale to a corresponding portion of a projected image to warp a portion of the projected image to match the portion of the captured image; and correlating the portions to determine the position within the captured image.

According to another aspect, the determined position within the calibration pattern is used to form a correspondence between a position in the captured image and a position in the calibration pattern.

According to another aspect, determining the spatial capture offset further comprises: extracting a non-offset window of a non-offset projection of the calibration pattern; extracting an offset window of an offset projection of the calibration pattern; and correlating the extracted non-offset window with the extracted offset window to determine the spatial capture offset.

According to another aspect, determining the scale further comprises calculating a ratio of the spatial capture offset to the projection offset.

According to another aspect, applying the determined scale to the portion of the captured image further comprises: determining a scale in each of a first direction and a second direction, the first and second directions being different; determining a width and height of the portion of the image using the determined scales; and locating a vertex of the portion of the captured image using the determined width and height.

According to another aspect, decoding the de-warped portion of the captured image further comprises correlating the de-warped portion with one or more pseudo-random dot patterns of the calibration pattern.

According to another aspect, capturing the reference image comprises capturing two images, each image containing a non-offset calibration pattern and an offset calibration pattern; and wherein determining the spatial capture offset comprises: extracting a non-offset calibration pattern by subtracting a first one of the two images from the second image; extracting an offset calibration pattern by subtracting the second of the two images from the first image; and comparing the non-offset calibration pattern and the offset calibration pattern to determine the spatial capture offset.

According to another aspect, the method further comprises: capturing a further image of the calibration pattern projected on the surface at an additional offset position, the additional offset position having an additional projection offset from the initial position by shifting the calibration pattern a predetermined amount in a direction different to the projection offset; determining an additional spatial capture offset for the calibration pattern between the initial position and the additional offset position; determining an additional scale from the additional spatial capture offset and the additional projection offset; and applying the determined scale and the determined additional scale to the portion of the captured image to de-warp the portion of the captured image.

According to another aspect, the method further comprises: determining an additional scale from the spatial capture offset and the projection offset, the additional scale being measured at a spatial location in the reference image, the spatial location being different to the determined location; and applying the determined scales to a portion of the captured image to de-warp the portion of the captured image.

According to another aspect, reproducing the visual content comprises projection of the visual content.

Another aspect of the present disclosure provides a non-transitory computer readable medium having a program stored thereon for calibrating reproduction visual content, the program comprising: code for capturing a reference image of a calibration pattern projected on a surface at an initial position and at an offset position, the offset position relating to a projection offset from the initial position by shifting the calibration pattern a predetermined amount; code for determining, using the reference image, a spatial capture offset for the calibration pattern between the initial position and the offset position, the spatial capture offset measuring a spatial shift of the calibration pattern in the reference image; code for determining a scale using the spatial capture offset and the projection offset; code for decoding a portion of a captured image, the captured image including the visual content and the calibration pattern, to determine a position within the calibration pattern by applying the determined scale, and code for calibrating reproduction of the visual content based on the determined position.

Another aspect of the present disclosure provides apparatus for reproducing visual content, the apparatus configured to: capture a reference image of a calibration pattern projected on a surface at an initial position and at an offset position, the offset position relating to a projection offset from the initial position by shifting the calibration pattern a predetermined amount; determine, using the reference image, a spatial capture offset for the calibration pattern between the initial position and the offset position, the spatial capture offset measuring a spatial shift of the calibration pattern in the reference image; determine a scale using the spatial capture offset and the projection offset; decode a portion of a captured image, the captured image including the visual content and the calibration pattern, to determine a position within the calibration pattern by applying the determined scale, and reproduce the visual content based on the determined position.

Another aspect of the present disclosure provides a system comprising: a plurality of projectors; an image capture device configured to capture an image of a projection surface; and a memory for storing data and a computer readable medium; and a processor coupled to the memory for executing a computer program, the processor in communication with the image capture device and the plurality of projectors via a network, the program having instructions for: receiving, from the image capture device, a first image of a calibration pattern projected on the projection surface by the plurality of projectors at an initial position; receiving, from the image capture device, a second image of the calibration pattern projected on the projection surface by the plurality of projectors at an offset position, the offset position relating to a projection offset from the initial position by shifting the calibration pattern a predetermined amount; determining, using the captured images, a spatial capture offset for the calibration pattern between the initial position and the offset position, the spatial capture offset measuring a spatial shift of the calibration pattern between the first and second images; determining a scale using the spatial capture offset and the projection offset; decoding a portion of a captured image received from the image capture device, the captured image including visual content and the calibration pattern, to determine a position within the calibration pattern by applying the determined scale, and reproducing the visual content based on the determined position using the plurality of projectors.

BRIEF DESCRIPTION OF THE DRAWINGS

One or more embodiments of the invention will now be described with reference to the following drawings, in which:

FIGS. 15A(1) and 15A(2) show an example of captured negative and positive frames that have been warped during projection and image capture;

FIGS. 15B(1) and 15B(2) show an example of subtracted non-offset and offset calibration pattern frames, corresponding to the captured positive and negative frames of in FIGS. 15A(1) and 15A(2);

FIGS. 17A(1) and 17A(2) show an example of determining vertices of a warped portion of a captured calibration pattern at a sampling position;

FIG. 17B shows an example of a warped portion within a captured calibration pattern, for the warped portion shown in FIGS. 17A(1) and 17A(2);

DETAILED DESCRIPTION INCLUDING BEST MODE

Context

Figure 1A:
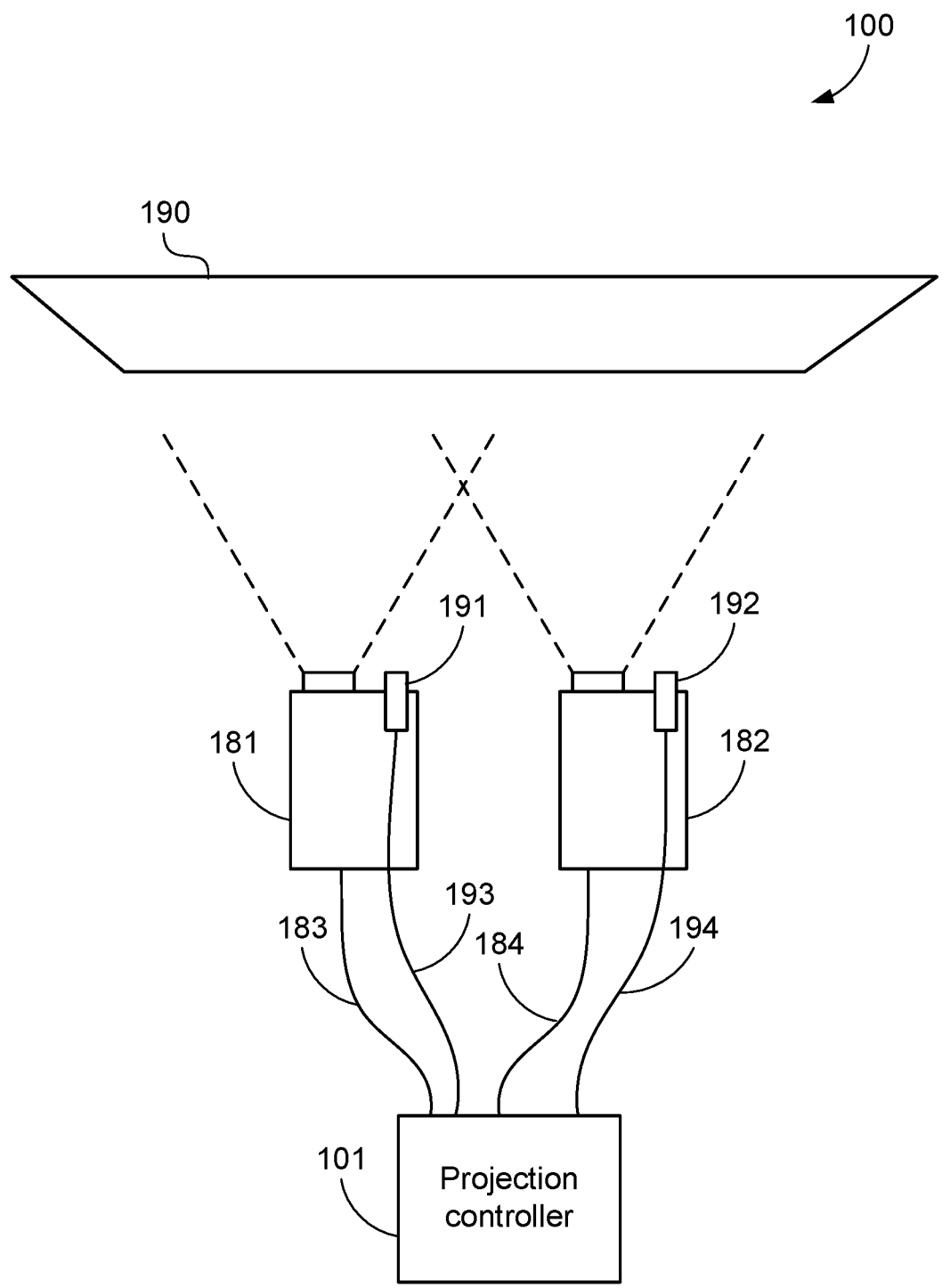
FIG. 1A shows an example of a multi-projector system.

FIG. 1A shows an example of a system 100 for reproducing visual content. The system 100 is a multi-projector system and includes a left-side projector 181, a left-side camera 191, a right-side projector 182, and a right-side camera 192. A projection controller 101 sends visual content such as images to each projector 181 and 182 via display cables 183 and 184, respectively. The projection controller 101 receives images from each camera 191 and 192 via cables 193 and 194, respectively. Each projector 181 and 182 projects the images sent by the projection controller 101 onto a projection surface 190. In the example of FIG. 1A, the projection surface 190 is planar (i.e. flat).

The left-side camera 191 typically captures an image containing the entire projection of the left-side projector 181 on the projection surface 190, and a portion of the projection of the right-side projector 182 on the projection surface 190. Similarly, the right-side camera 192 typically captures an image containing the entire projection of the right-side projector 182 on the projection surface 190, and a portion of the projection of the left-side projector 181 on the projection surface 190. The projection controller 101 therefore receives images from the cameras 191 and 192 of the images that are projected with projectors 181 and 182.

Each of the cameras 191 and 192 is typically mounted on the corresponding one of the projectors 181 and 182 at a fixed position. For example, the left-side camera 191 is fixed to the left-side projector 181, and the right-side camera 192 is fixed to the right-side projector 182. Alternatively, a camera may be integrated within a projector to form a single device that can project and capture images.

Each of the cameras 191 and 192 may be any image capture device suitable for capturing an image of the surface 190 and transmitting captured images to the projection controller 101, for example a digital camera or a video camera. Each of the projectors 181 and 182 may be any type of projection device capable of receiving data representing visual content from the application 133 and projecting the visual content onto a surface such as a wall, a projection screen, or the like. The projectors 181 and 182 represent means of rendering or reproducing the visual content by projecting content such as the content image 200 on the surface 190.

The multi-projector system 100 is configured to display a single aligned reproduction of content, such as a content image, on the projection surface 190. Each projector 181 and 182 projects a portion of the single aligned content image. A calibration pattern is embedded within each portion of the content image projected by the projectors 181 and 182. The projection controller 101 uses images of the calibration pattern captured by the cameras 191 and 192 to calibrate and align the portions of the projected content image. The content image displayed (reproduced) on the projection surface 190 appears to a viewer to be a single, upright image, with no seam between the two projected images.

The arrangements described relate to a method of projecting a calibration pattern embedded within visual content such as a content image, and un-warping a captured calibration pattern prior to decoding the calibration pattern, as performed by the projection controller 101. Other configurations of the arrangements described include more than two projectors, and/or one or more cameras. In the example of FIG. 1A, the projection controller 101 relates to a general purpose computer. In alternative embodiments, the projection controller 101 relates to a software module executed on an embedded controller within a projector, or a projection controller device. Further, the projection surface 190 may be flat, curved, or some other irregular shape, for example.

Figure 1B:
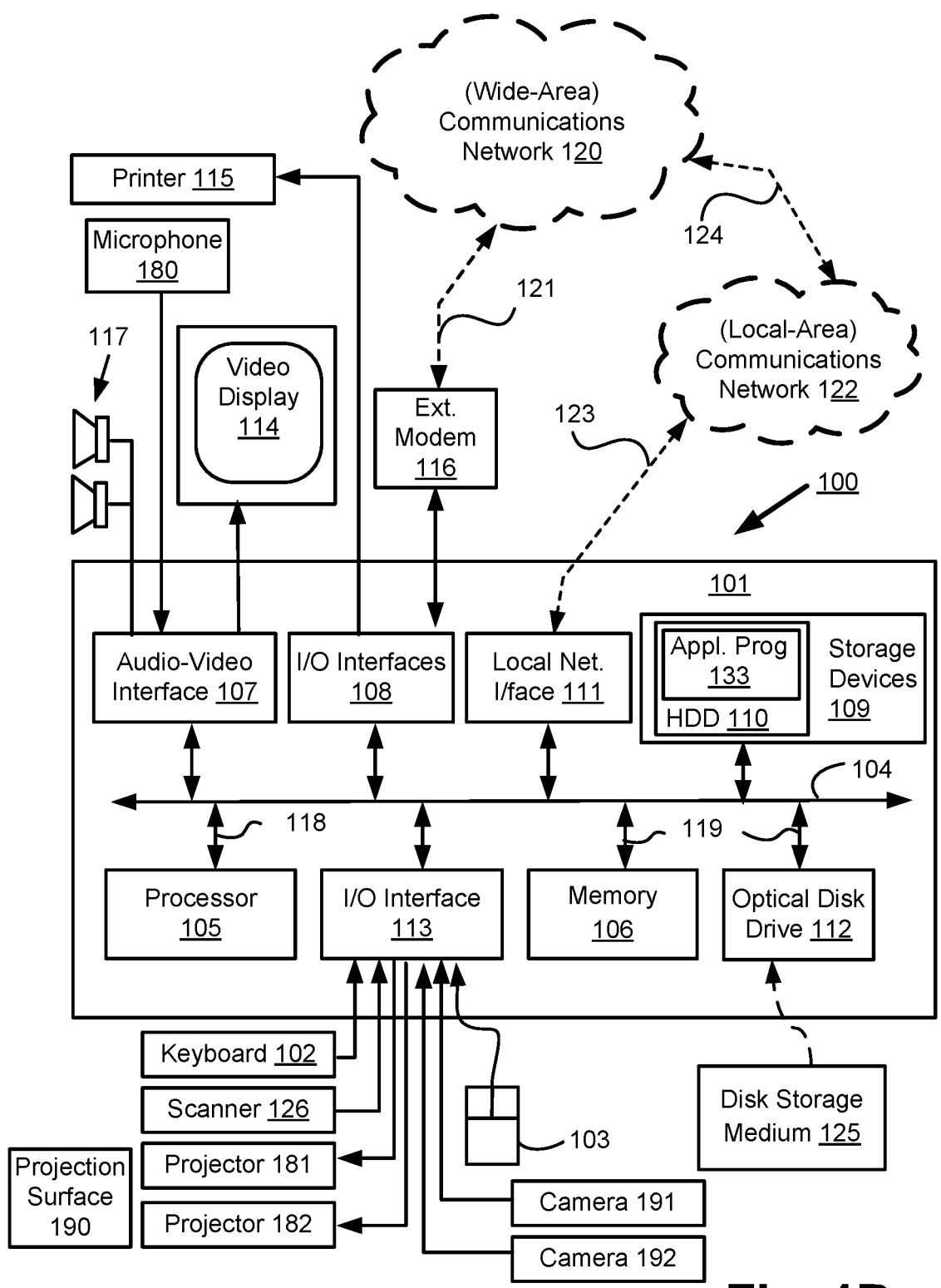
FIGS. 1B and 1C show form a schematic block diagram of a general purpose computer system upon which arrangements described can be practiced.
Figure 1C:
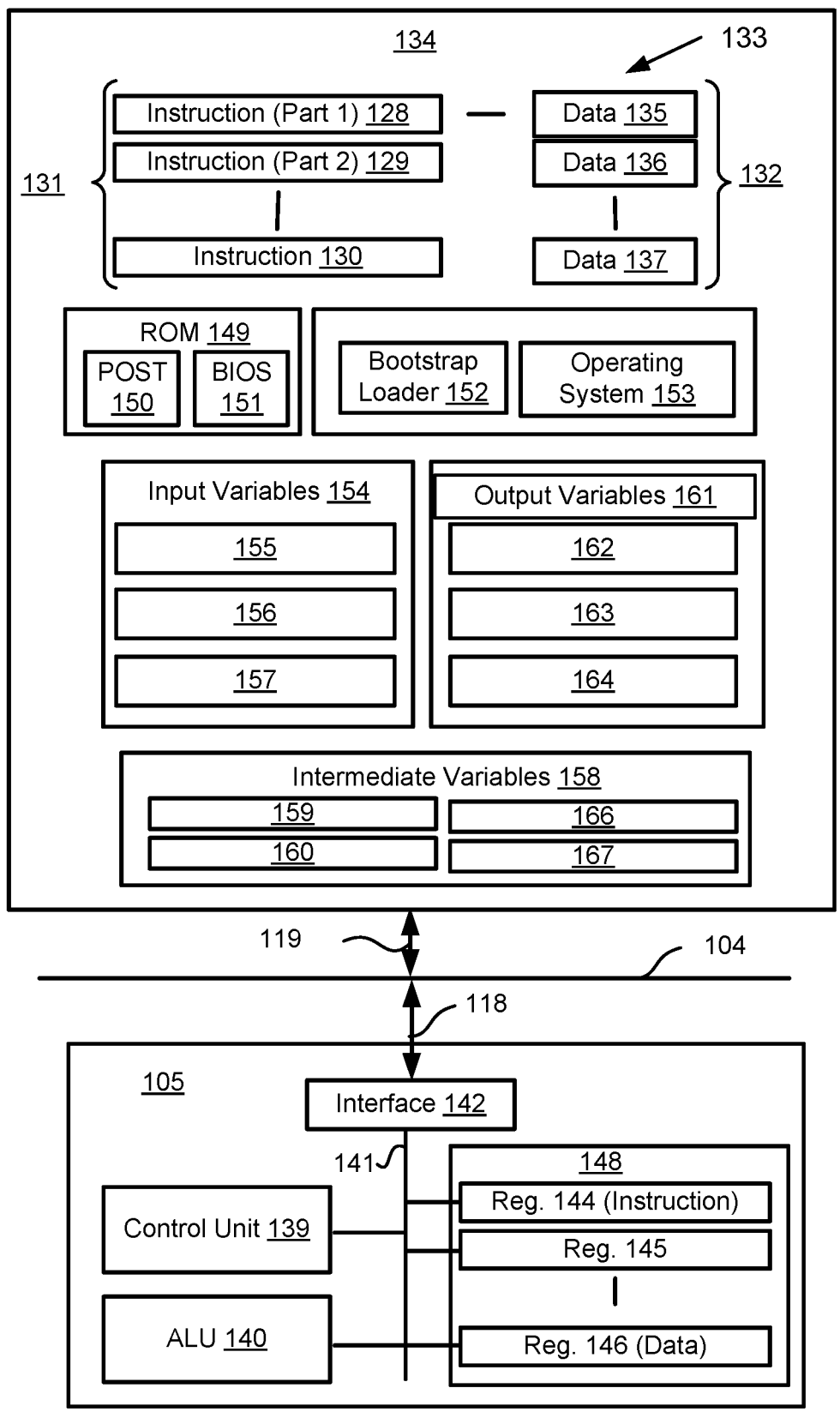

FIGS. 1B and 1C depict a general-purpose computer system 100, upon which the various arrangements described can be practiced.

As seen in FIG. 1B, the computer system 100 includes: a computer module 101; input devices such as a keyboard 102, a mouse pointer device 103, a scanner 126, the cameras 191 and 192, and a microphone 180; and output devices including a printer 115, a display device 114, loudspeakers 117 and the projectors 181 and 182. An external Modulator-Demodulator (Modem) transceiver device 116 may be used by the computer module 101 for communicating to and from a communications network 120 via a connection 121. The communications network 120 may be a wide-area network (WAN), such as the Internet, a cellular telecommunications network, or a private WAN. Where the connection 121 is a telephone line, the modem 116 may be a traditional "dial-up" modem. Alternatively, where the connection 121 is a high capacity (e.g., cable) connection, the modem 116 may be a broadband modem. A wireless modem may also be used for wireless connection to the communications network 120.

The computer module 101 relates to the projection controller 101. The computer module 101 typically includes at least one processor unit 105, and a memory unit 106. For example, the memory unit 106 may have semiconductor random access memory (RAM) and semiconductor read only memory (ROM). The computer module 101 also includes an number of input/output (I/O) interfaces including: an audio-video interface 107 that couples to the video display 114, loudspeakers 117 and microphone 180; an I/O interface 113 that couples to the keyboard 102, mouse 103, scanner 126, camera 127 and optionally a joystick or other human interface device (not illustrated); and an interface 108 for the external modem 116 and printer 115. In some implementations, the modem 116 may be incorporated within the computer module 101, for example within the interface 108. The computer module 101 also has a local network interface 111, which permits coupling of the computer system 100 via a connection 123 to a local-area communications network 122, known as a Local Area Network (LAN). As illustrated in FIG. 1B, the local communications network 122 may also couple to the wide network 120 via a connection 124, which would typically include a so-called "firewall" device or device of similar functionality. The local network interface 111 may comprise an Ethernet circuit card, a Bluetooth® wireless arrangement or an IEEE 802.11 wireless arrangement; however, numerous other types of interfaces may be practiced for the interface 111. In some arrangement, the projectors 181 and 182 and the cameras 191 and 192 may communicate with the computer module 101 via a network such as the networks 120 and 122.

The I/O interfaces 108 and 113 may afford either or both of serial and parallel connectivity, the former typically being implemented according to the Universal Serial Bus (USB) standards and having corresponding USB connectors (not illustrated). Storage devices 109 are provided and typically include a hard disk drive (HDD) 110. Other storage devices such as a floppy disk drive and a magnetic tape drive (not illustrated) may also be used. An optical disk drive 112 is typically provided to act as a non-volatile source of data. Portable memory devices, such optical disks (e.g., CD-ROM, DVD, Blu-ray Disc™), USB-RAM, portable, external hard drives, and floppy disks, for example, may be used as appropriate sources of data to the system 100.

The components 105 to 113 of the computer module 101 typically communicate via an interconnected bus 104 and in a manner that results in a conventional mode of operation of the computer system 100 known to those in the relevant art. For example, the processor 105 is coupled to the system bus 104 using a connection 118. Likewise, the memory 106 and optical disk drive 112 are coupled to the system bus 104 by connections 119. Examples of computers on which the described arrangements can be practised include IBM-PC's and compatibles, Sun Sparcstations, Apple Mac™ or like computer systems.

The method of reproducing visual content may be implemented using the computer system 100 wherein the processes of FIGS. 7 to 13, to be described, may be implemented as one or more software application programs 133 executable within the computer system 100. The application 133 typically includes other software modules for implementing other methods in addition to controlling alignment. In particular, the steps of the method of reproducing visual content are effected by instructions 131 (see FIG. 1C) in the software 133 that are carried out within the computer system 100. The software instructions 131 may be formed as one or more code modules, each for performing one or more particular tasks. The software may also be divided into two separate parts, in which a first part and the corresponding code modules performs the described methods and a second part and the corresponding code modules manage a user interface between the first part and the user.

The software may be stored in a computer readable medium, including the storage devices described below, for example. The software is loaded into the computer system 100 from the computer readable medium, and then executed by the computer system 100. A computer readable medium having such software or computer program recorded on the computer readable medium is a computer program product. The use of the computer program product in the computer system 100 preferably effects an advantageous apparatus for reproducing visual content.

The software 133 is typically stored in the HDD 110 or the memory 106. The software is loaded into the computer system 100 from a computer readable medium, and executed by the computer system 100. Thus, for example, the software 133 may be stored on an optically readable disk storage medium (e.g., CD-ROM) 125 that is read by the optical disk drive 112. A computer readable medium having such software or computer program recorded on it is a computer program product. The use of the computer program product in the computer system 100 preferably effects an apparatus for reproducing visual content.

In some instances, the application programs 133 may be supplied to the user encoded on one or more CD-ROMs 125 and read via the corresponding drive 112, or alternatively may be read by the user from the networks 120 or 122. Still further, the software can also be loaded into the computer system 100 from other computer readable media. Computer readable storage media refers to any non-transitory tangible storage medium that provides recorded instructions and/or data to the computer system 100 for execution and/or processing. Examples of such storage media include floppy disks, magnetic tape, CD-ROM, DVD, Blu-ray™ Disc, a hard disk drive, a ROM or integrated circuit, USB memory, a magneto-optical disk, or a computer readable card such as a PCMCIA card and the like, whether or not such devices are internal or external of the computer module 101. Examples of transitory or non-tangible computer readable transmission media that may also participate in the provision of software, application programs, instructions and/or data to the computer module 101 include radio or infra-red transmission channels as well as a network connection to another computer or networked device, and the Internet or Intranets including e-mail transmissions and information recorded on Websites and the like.

The second part of the application programs 133 and the corresponding code modules mentioned above may be executed to implement one or more graphical user interfaces (GUIs) to be rendered or otherwise represented upon the display 114. Through manipulation of typically the keyboard 102 and the mouse 103, a user of the computer system 100 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 117 and user voice commands input via the microphone 180.

FIG. 1C is a detailed schematic block diagram of the processor 105 and a "memory" 134. The memory 134 represents a logical aggregation of all the memory modules (including the HDD 109 and semiconductor memory 106) that can be accessed by the computer module 101 in FIG. 1B.

When the computer module 101 is initially powered up, a power-on self-test (POST) program 150 executes. The POST program 150 is typically stored in a ROM 149 of the semiconductor memory 106 of FIG. 1B. A hardware device such as the ROM 149 storing software is sometimes referred to as firmware. The POST program 150 examines hardware within the computer module 101 to ensure proper functioning and typically checks the processor 105, the memory 134 (109, 106), and a basic input-output systems software (BIOS) module 151, also typically stored in the ROM 149, for correct operation. Once the POST program 150 has run successfully, the BIOS 151 activates the hard disk drive 110 of FIG. 1B. Activation of the hard disk drive 110 causes a bootstrap loader program 152 that is resident on the hard disk drive 110 to execute via the processor 105. This loads an operating system 153 into the RAM memory 106, upon which the operating system 153 commences operation. The operating system 153 is a system level application, executable by the processor 105, to fulfil various high level functions, including processor management, memory management, device management, storage management, software application interface, and generic user interface.

The operating system 153 manages the memory 134 (109, 106) to ensure that each process or application running on the computer module 101 has sufficient memory in which to execute without colliding with memory allocated to another process. Furthermore, the different types of memory available in the system 100 of FIG. 1B must be used properly so that each process can run effectively. Accordingly, the aggregated memory 134 is not intended to illustrate how particular segments of memory are allocated (unless otherwise stated), but rather to provide a general view of the memory accessible by the computer system 100 and how such is used.

As shown in FIG. 1C, the processor 105 includes a number of functional modules including a control unit 139, an arithmetic logic unit (ALU) 140, and a local or internal memory 148, sometimes called a cache memory. The cache memory 148 typically includes a number of storage registers 144-146 in a register section. One or more internal busses 141 functionally interconnect these functional modules. The processor 105 typically also has one or more interfaces 142 for communicating with external devices via the system bus 104, using a connection 118. The memory 134 is coupled to the bus 104 using a connection 119.

The application program 133 includes a sequence of instructions 131 that may include conditional branch and loop instructions. The program 133 may also include data 132 which is used in execution of the program 133. The instructions 131 and the data 132 are stored in memory locations 128, 129, 130 and 135, 136, 137, respectively. Depending upon the relative size of the instructions 131 and the memory locations 128-130, a particular instruction may be stored in a single memory location as depicted by the instruction shown in the memory location 130. Alternately, an instruction may be segmented into a number of parts each of which is stored in a separate memory location, as depicted by the instruction segments shown in the memory locations 128 and 129.

In general, the processor 105 is given a set of instructions which are executed therein. The processor 105 waits for a subsequent input, to which the processor 105 reacts to by executing another set of instructions. Each input may be provided from one or more of a number of sources, including data generated by one or more of the input devices 102, 103, data received from an external source across one of the networks 120, 102, data retrieved from one of the storage devices 106, 109 or data retrieved from a storage medium 125 inserted into the corresponding reader 112, all depicted in FIG. 1B. The execution of a set of the instructions may in some cases result in output of data. Execution may also involve storing data or variables to the memory 134.

The arrangements described use input variables 154, which are stored in the memory 134 in corresponding memory locations 155, 156, 157. The arrangements described produce output variables 161, which are stored in the memory 134 in corresponding memory locations 162, 163, 164. Intermediate variables 158 may be stored in memory locations 159, 160, 166 and 167.

Referring to the processor 105 of FIG. 1C, the registers 144, 145, 146, the arithmetic logic unit (ALU) 140, and the control unit 139 work together to perform sequences of micro-operations needed to perform "fetch, decode, and execute" cycles for every instruction in the instruction set making up the program 133. Each fetch, decode, and execute cycle comprises:

a fetch operation, which fetches or reads an instruction 131 from a memory location 128, 129, 130;

a decode operation in which the control unit 139 determines which instruction has been fetched; and an execute operation in which the control unit 139 and/or the ALU 140 execute the instruction.

Thereafter, a further fetch, decode, and execute cycle for the next instruction may be executed. Similarly, a store cycle may be performed by which the control unit 139 stores or writes a value to a memory location 132.

Each step or sub-process in the processes of FIGS. 7 to 13 is associated with one or more segments of the program 133 and is performed by the register section 144, 145, 147, the ALU 140, and the control unit 139 in the processor 105 working together to perform the fetch, decode, and execute cycles for every instruction in the instruction set for the noted segments of the program 133.

The method of reproducing of visual content may alternatively be implemented in dedicated hardware such as one or more integrated circuits performing the functions or sub functions of FIGS. 7 to 13. Such dedicated hardware may include graphic processors, digital signal processors, or one or more microprocessors and associated memories.

Figure 2A:
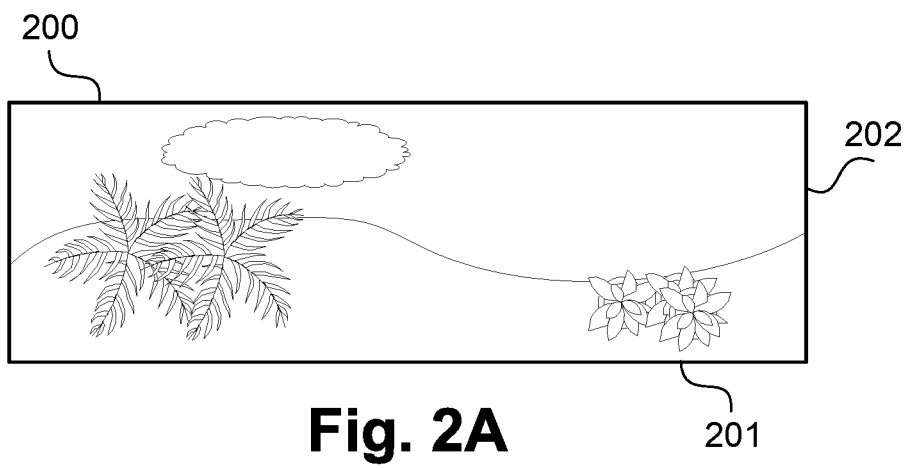
FIGS. 2A and 2B show an example of the alignment and blending of two projections using the multi-projector system of FIG. 1.

FIG. 2A shows an example of a content image 200 to be displayed using the multi-projector system 100. The content image 200 has a wide aspect ratio, having a width 201 greater than a height 202. The image 200 can be optimally displayed using a multi-projector system consisting of at least two projectors side-by-side, such as the multi-projector system 100.

Figure 2B:
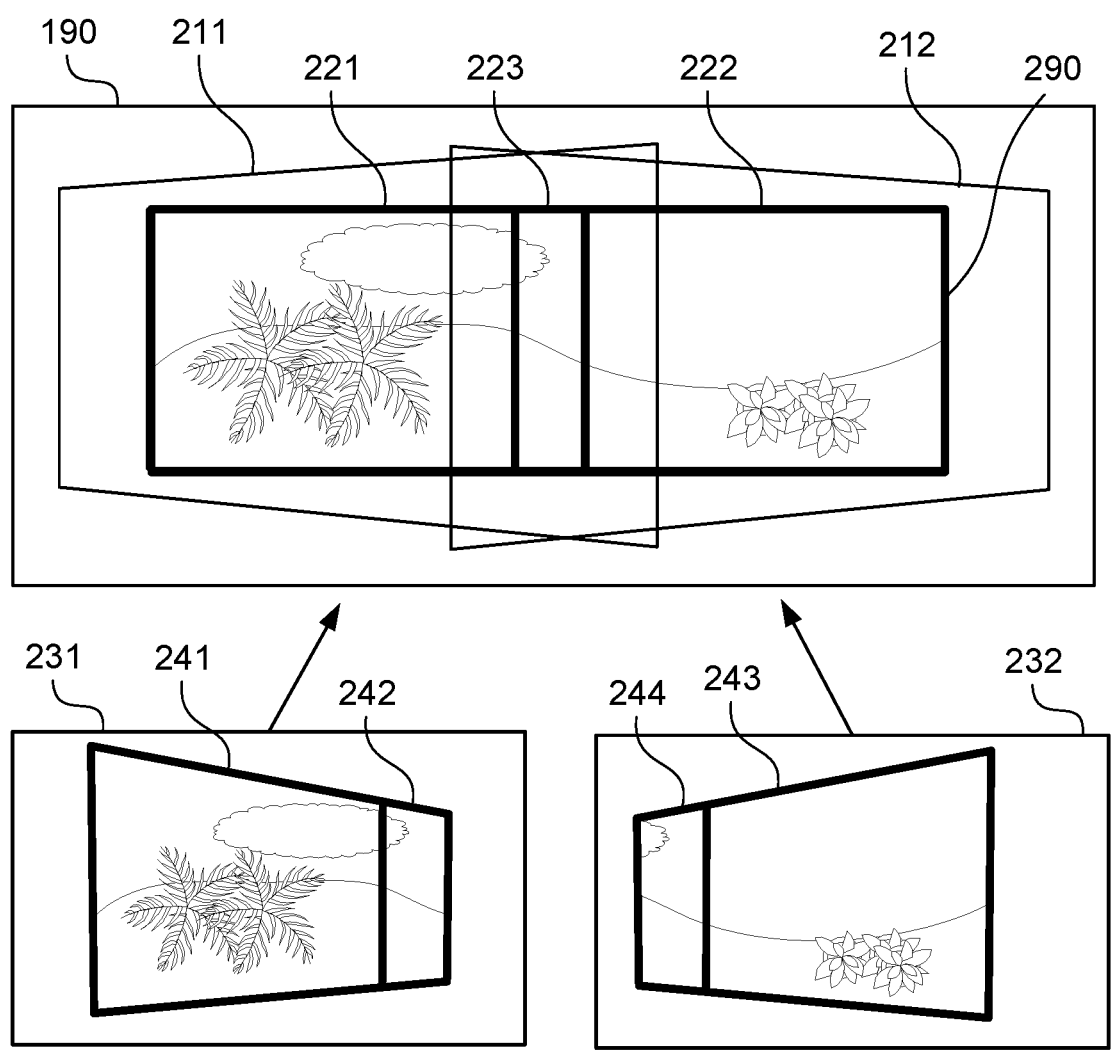

FIG. 2B illustrates the projection (reproduction) of content image 200 using two projectors, for example, the projectors 181 and 182 of the multi-projector system 100. A projector image displayed by the left-side projector 181 is shown in FIG. 2B as projected image 231. A projector image displayed by the right-side projector 182 is shown in FIG. 2B as projected image 232. Each of the projector images 231 and 232 comprises a rectangular array of projector pixels, for example 1920 horizontal pixels by 1200 vertical pixels. Each projector pixel comprises a number of values representing intensity of particular colour channels. For example, each projector pixel may comprise 1 byte (8 bits) for a red colour channel, 1 byte for a blue colour channel and 1 byte for a green colour channel. If the left-side projector 181 were to project all pixels of the projected image 231, the projection would result in a large trapezoidal shape 211 on the projection surface 190. Similarly, if the right-side projector 182 were to project all pixels of the projected image 232, the projection would result in a large trapezoidal shape 212 on the projection surface 190. The software application 133 therefore displays the content image 200 using a subset of pixels of each of the projector images 231 and 232.

The left-side projector 181 projects onto two regions 241 and 242 for displaying two portions of the content image 200 in the projected image 231. The region 241 contains a portion of the content image 200 that is only projected by the left-side projector 181. The region 242 contains a portion of the content image 200 that is projected by both the left-side projector 181 and the right-side projector 182. The region 241 of the projected image 231 is projected onto a region 221 of the projection surface 190. The second region 242 of the projected image 231 is projected onto a region 223 of the projection surface 190.

The right-side projector 182 includes two regions 243 and 244 for displaying two portions of the content image 200 in the projected image 232. The region 243 contains a portion of the content image 200 that is only projected by the right-side projector 182. The region 244 contains a portion of the content image 200 that is projected by both the left-side projector 181 and the right-side projector 182. The region 243 of the projected image 232 is projected onto a region 222 of the projection surface 190. The region 244 of the projected image 232 is projected onto a region 223 of the projection surface 190.

The projected regions 221-223 are aligned on the projection surface 190, such that an overall projected image 290 is reproduced in an upright manner, and includes no seams between the regions 221-223. The projected regions 221, 223 and 222 together form the single aligned projected image 290 formed by operation of the projectors 181 and 182.

Both of the projectors 181 and 182 project a portion of the content image onto the projected region 223. The region 223 corresponds to the region 242 of the left-side projected image 231 and the portion 244 of the right-side projected image 232. The overlap of projection at region 223 is known in the art as "blending". Projection region 223 is therefore referred to as the "blend region". Within the blend region 223, both projectors 181 and 182 are said to "contribute" to the projected image 290.

The blend region 231 may also be referred to as the "overlap region" or "overlap area". In other arrangements, the overlap region is an intersection of the regions of the surface that can potentially be projected onto by each of the projectors. For example, with reference to FIG. 2B, the overlap area may be considered to be the intersection of regions 211 and 212, which contains the blend region 223.

The software application 133 executes to control which portions of the content image 200 are included in each projector image 231 and 232, and the boundaries of the regions 241-244 of the content image 200 within each projected image 231 and 232. The software application 133 executes to ensure the projected regions 221-223 are aligned on the projection surface 160. The application 133 effectively executes to reproduce the content image 200 such that projection of the projectors 181 and 182 is aligned.

As discussed above with reference to FIG. 1A, a calibration pattern is embedded in a projected content image. A camera (e.g., the camera 191 and/or the camera 192) captures one or more images. The captured images include the projected content image and the calibration pattern. The embedded calibration pattern is determined by execution of the application 133. The calibration pattern is decoded, and is used to perform alignment of the projectors to reproduce visual content with decreased distortion.

Figure 3A:
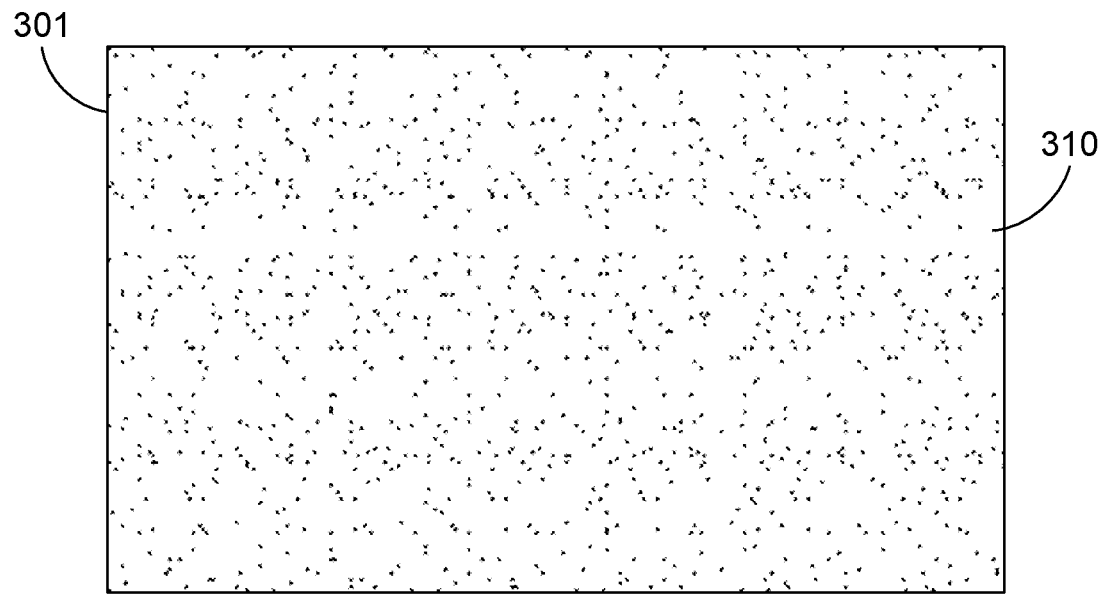
FIG. 3A shows an example of a calibration pattern consisting of a pseudo-random dot pattern.

FIG. 3A shows an example calibration pattern 301. A calibration pattern typically consists of one or more calibration marks. The calibration marks can be processed to determine a position within the calibration pattern. The calibration pattern 301 consists of a pseudo-random pattern of dots (each calibration mark is a dot), for example, dot 310. A dot is a small group of pixels of a contrasting intensity in comparison with surrounding pixels. For example a dot may be square shaped, consisting of 4×4 projector pixels. The dimensions (size) of dots are typically chosen such that dots are detectable in captured camera images of the projected calibration pattern. Other calibration patterns may consist of dots at regular locations on a grid, or other types of calibration marks, such as circles, lines or irregular shapes. The calibration pattern 301 is preferably the same size as the projected images 231 and 232. The calibration pattern 301 being the same size as the images 231 and 232 enables a position in a projected image to be determined, by decoding the dots in a calibration pattern, for example, captured by a camera such as camera 191.

The calibration pattern 301 is typically embedded in a projected portion of a content image, for example a projected portion of the image 290. In a preferred arrangement, a viewer is not able to perceive the presence of the calibration pattern 301 in the projected image 290. "Pattern subtraction" is a technique known in the art of projection for making a projected calibration pattern imperceptible to a human viewer. In one example, two consecutive frames of projected content, the calibration marks of the calibration pattern 301 are added to, and subtracted from, intensity values of the projected image. A projected image with a calibration pattern added is known as a "positive frame". A projected image with a calibration pattern subtracted is known as a "negative frame". If the positive and negative frames are projected in sequence at a sufficiently high frame rate (e.g. 120 Hz), the viewer will not perceive the presence of the calibration pattern in the projected image. However, in other arrangements, pattern subtraction is not used.

A camera (e.g., the camera 191 and/or 192) captures an image of each positive and negative frame individually. The application 133 executes to subtract the captured negative frame from the captured positive frame, which results in a "subtracted frame". The subtracted frame typically contains the calibration marks, with the projected content substantially removed. Due to camera sensor noise, lighting variation, etc., the subtracted frame may contain noise, and the calibration marks in the captured frame may be of reduced intensity compared with the projected calibration marks. The subtracted frame is then processed by the application 133.

Figure 3B:
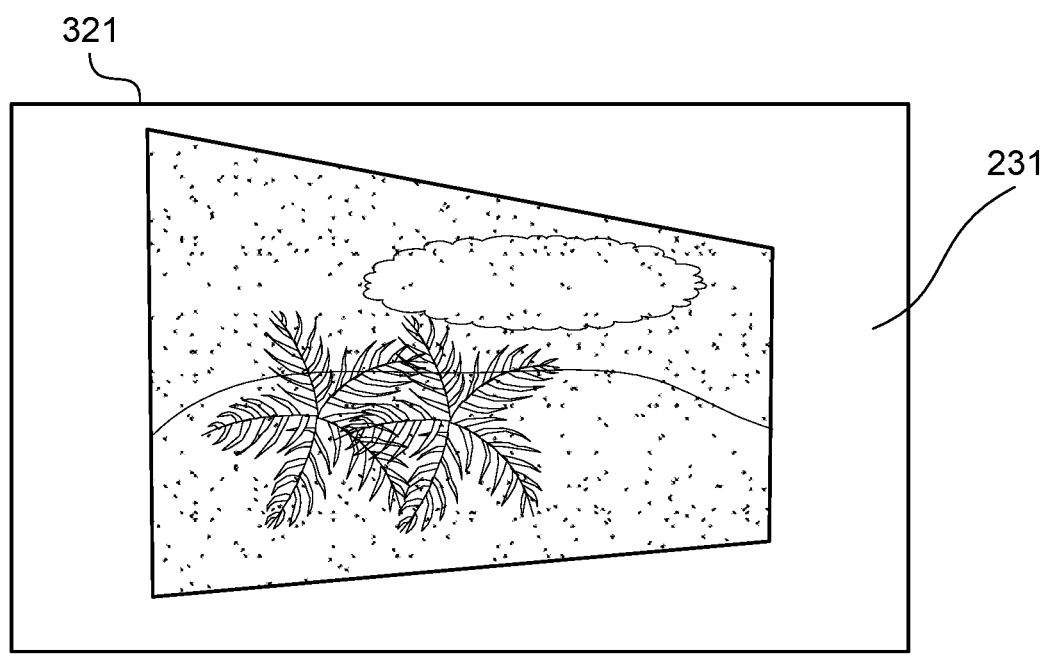
FIG. 3B shows an example of a calibration pattern corresponding to the calibration pattern of FIG. 3A, in which a pseudo-random dot pattern is embedded in a projector image.

FIG. 3B shows an example of a negative or positive frame 321 projected by the left-side projector 181, consisting of the calibration pattern 301 subtracted from, or added to, the projector image 231. Preferably, the calibration marks are only subtracted or added where a portion of the content image 200 is displayed (e.g. within the portions 241 or 242).

Typically, a calibration pattern is projected by each projector in sequence. For example, the left-side projector 181 first projects the calibration pattern, consisting of the negative frame followed by the positive frame. Then, the right-side projector 182 projects the calibration pattern, again consisting of the negative frame followed by the positive frame. An image of each projected calibration pattern is captured by one or more cameras. For example, a calibration pattern projected by the left-side projector 181 is captured by both the left-side camera 191 and the right-side camera 192.

Figure 4A:
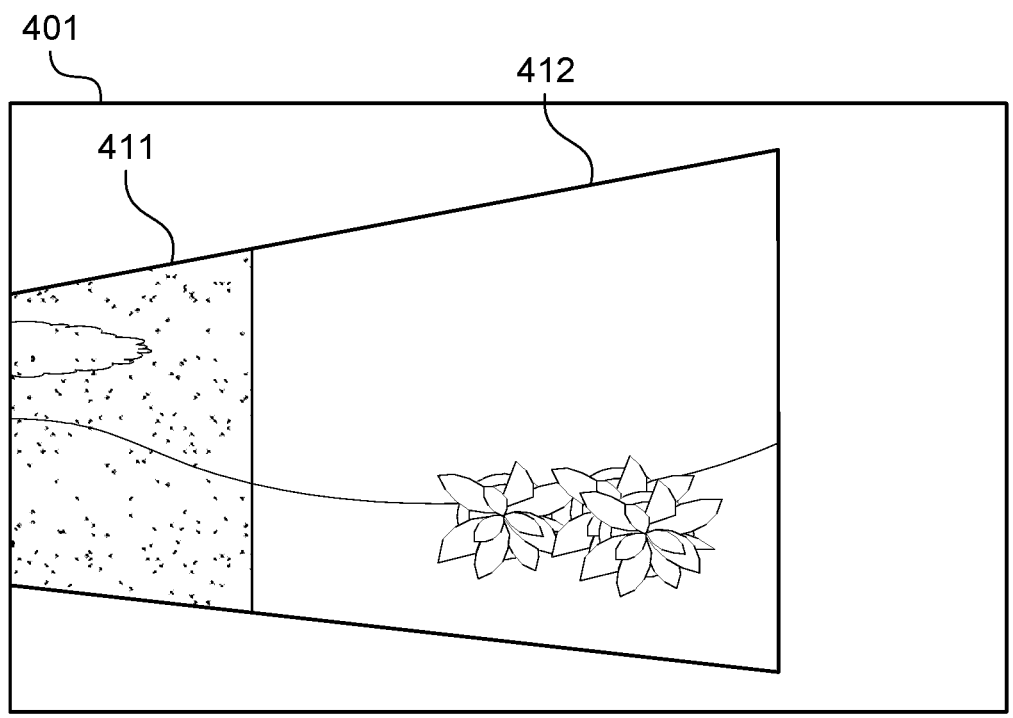
FIG. 4A shows an example of a captured frame, captured by a camera of the multi-projector system of FIG. 1A.

FIG. 4A shows an example of a captured negative frame 401. A captured positive frame is similar to a captured negative frame, except that calibration marks in the captured positive frame are be brighter than the surrounding pixels. In the example shown in FIG. 4A, the captured frame 401 is captured by the right-side camera 192, and is received by the projection controller 101. The captured frame 401 contains two regions: a region 411 that is projected with the left-side projector 181 (and partially the right-side projector 182), and a region 412 that is projected with the right-side projector 182 only. Since only the left-side projector 181 is projecting a calibration pattern, the captured frame 401 contains calibration marks only in the region 411 that is projected with the left-side projector 181.

Figure 4B:
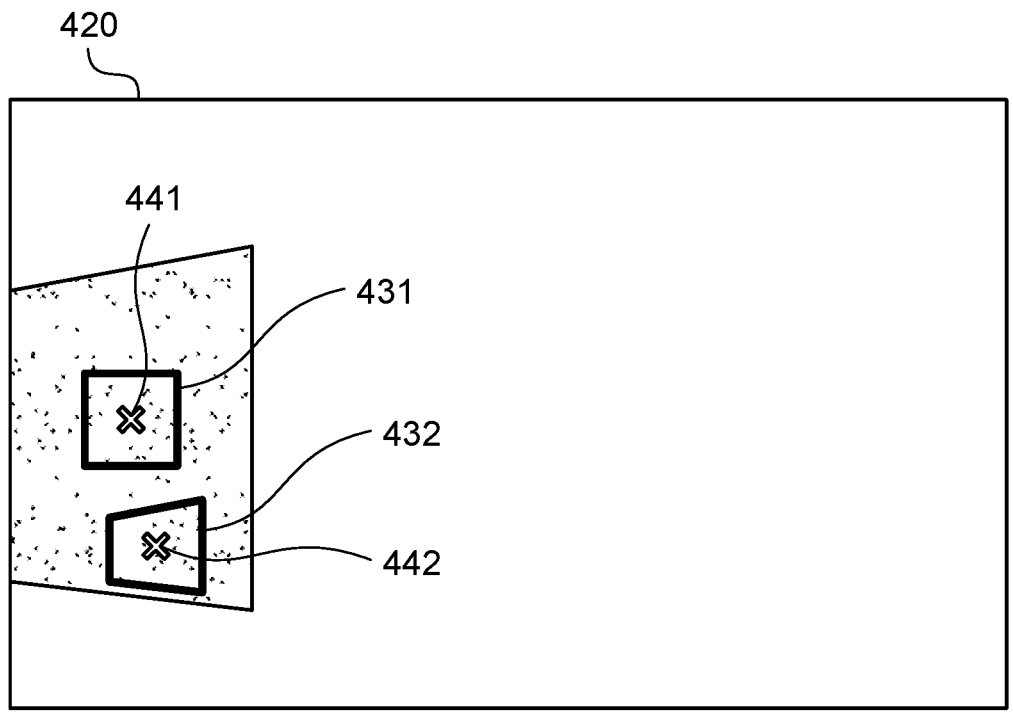
FIG. 4B shows an example of a subtracted frame, formed by subtracting a captured negative frame from a captured positive frame.

FIG. 4B shows an example of a subtracted frame 420. The subtracted frame 420 is created by the application 133 by subtracting a captured negative frame (e.g. the frame 401) from a captured positive frame. The subtracted frame 420 accordingly contains calibration marks of the calibration pattern 301. The subtracted frame 420 may also contain noise, as described previously.

As shown in FIG. 4A and FIG. 4B, the captured images of the projected content and calibration pattern are warped (distorted) in comparison to one another. As described previously, warping can be due to projector or camera lens distortion, or differing resolution of projector and camera, for example. In the example shown in FIG. 4A and FIG. 4B, the warping is primarily due to relatively different poses of the left-side projector 181 and the right-side camera 182. The different poses of the projectors 181 and 192 causes an amount of perspective warping in the captured image 401 and the subtracted image of the calibration pattern 420. Warping generally causes the captured image of a calibration pattern to have a different geometrical appearance than the projected calibration pattern. For example, if a square shape is projected, a warped image of the shape may be a parallelogram or other quadrilateral.

In arrangements where pattern subtraction is not used, the calibration pattern is reproduced at initial and offset positions in a single projection. The projection can be similar to FIG. 4A for example. A captured image of the calibration pattern projected on the surface 190 can contain warping, caused by the projection surface 190 for example, compared to the calibration pattern projected by the projector.

Decoding in the context of the arrangements described relates to extracting an un-warped portion of a captured image (or a warped portion of a projected image) and correlating the extracted portion with the calibration pattern. Referring to the example of FIGS. 4A and 4B, to decode the calibration pattern, the subtracted image 420 containing the calibration pattern is used. At a sampling position, a portion of the image is extracted, and is correlated with the projected calibration pattern 301. FIG. 4B shows two possible portions 431 and 432 of the captured image of the calibration pattern image 420. The portions 431 and 432 correspond to sampling positions 441 and 442, respectively. Portion 431 has a square outline but, due to the perspective warping of the captured calibration pattern, contains a portion of the calibration pattern that is warped. Therefore, if the calibration pattern within portion 431 is used to decode the calibration pattern, the decoding will be unsuccessful. Conversely, the portion 432 has a trapezoidal outline that matches the perspective warping of the calibration pattern. Therefore, if the calibration pattern contained within portion 432 is selected and is un-warped, the decoding will be successful.

The goal of un-warping (also referred to as de-warping or un-distorting), is to substantially eliminate the warping of the calibration pattern caused during projection and capture, so that the calibration pattern can be decoded successfully.

Un-warping involves calculating the boundary of a portion of a captured calibration pattern image, and transforming the contained portion of the calibration pattern to match the projected calibration pattern. The arrangements described hereafter determine the boundary of a portion of a captured calibration pattern image, such that when the portion is un-warped, the un-warped portion corresponds to a square region within the projected calibrated pattern.

Figure 5A:
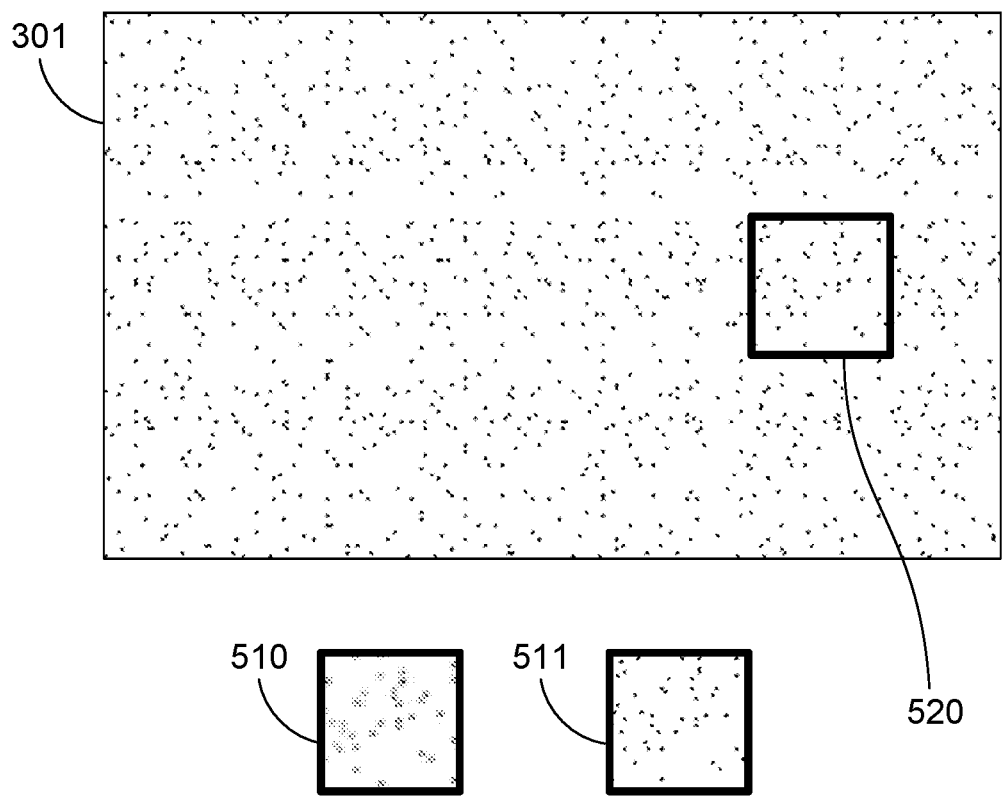
FIG. 5A shows an example of decoding a pseudo-random dot pattern using direct correlation.

FIG. 5A relates to an example of decoding a pseudo-random dot pattern at a position within a captured calibration pattern image, using direct correlation. The method of decoding used first extracts a portion of a captured calibration pattern image. For example, a portion 510 corresponds to the portion 431 within the calibration pattern image 420. The extracted portion 510 is then correlated with the projected calibration pattern 310 using known techniques. A commonly-used correlation technique takes the Discrete Fourier Transform (DFT) of both the extracted portion 510 and the calibration pattern 301. The spectra produced by the DFT are then multiplied, and the result is transformed back to the spatial domain using the inverse DFT (iDFT). The iDFT produces an image that contains many intensities, where the largest intensity corresponds to a location (offset, shift) of the extracted portion within the calibration pattern that has the highest correlation (i.e. the best match).

However, if the extracted portion 510 is warped, in comparison with the calibration pattern, a correct shift may not be found. For example, because the extracted portion 510 is warped, the correct shift within the calibration pattern 301 may not be found.

If the extracted portion 510 is un-warped correctly, a correct shift within the calibration pattern 301 is likely to be found. For example, an extracted portion 511 has been un-warped correctly, and corresponds to the portion 432 within the calibration pattern image 420. If the un-warped extracted portion 511 is correlated with the projected calibration pattern 301, a correct location 520 is found. Correctly un-warping an extracted patch is critical in finding a correct location of the extracted patch within the calibration pattern, and in forming correct correspondences between projector and camera.

Figure 5B:
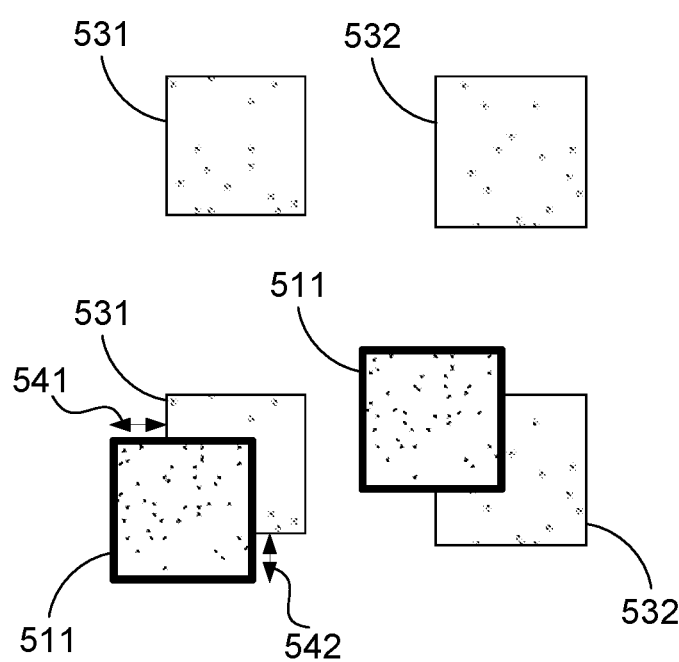
FIG. 5B shows an example of decoding a pseudo-random dot pattern that is formed by tiling two or more smaller tiles throughout the calibration pattern.
Figure 5C:
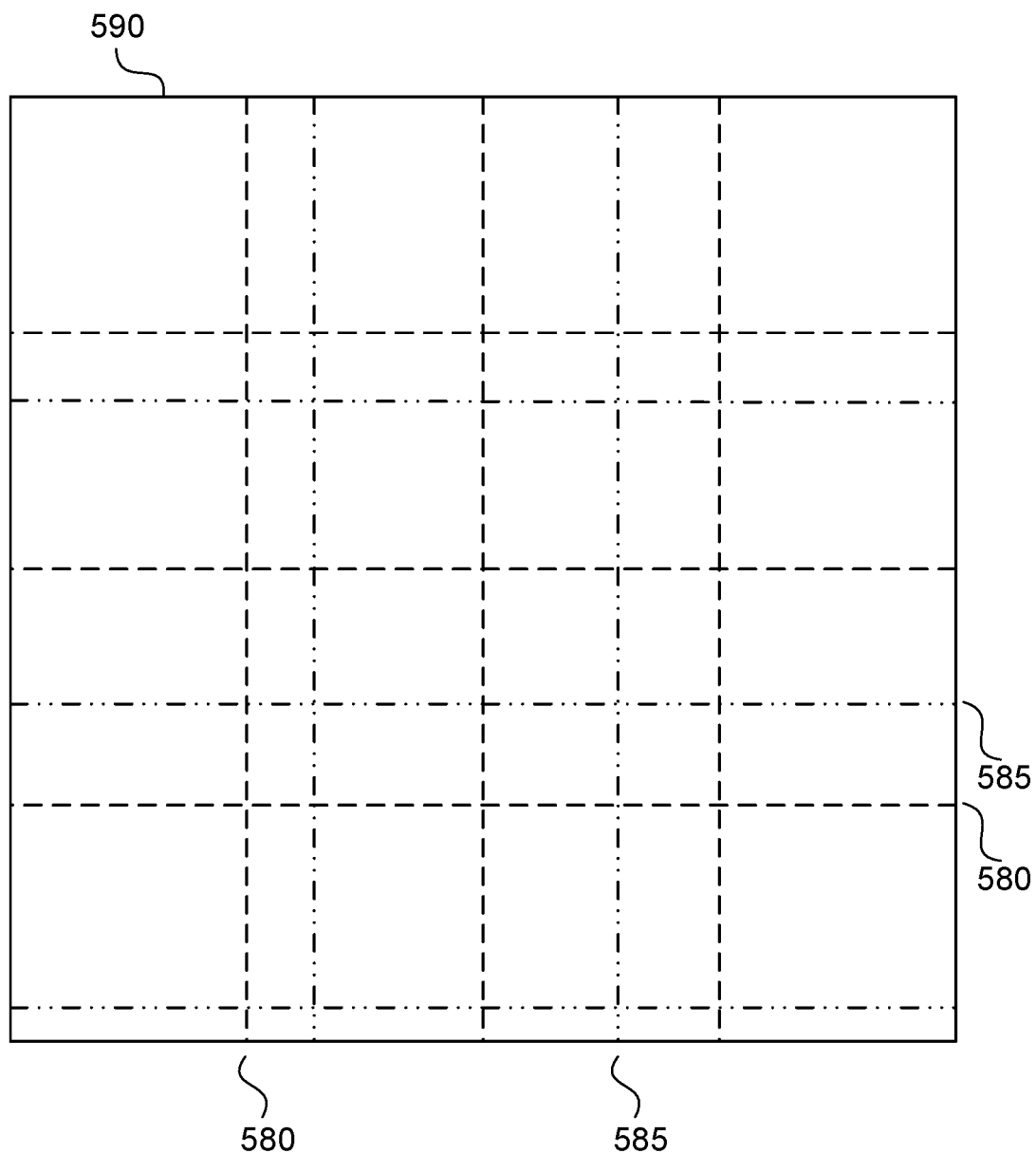
FIG. 5C shows a calibration pattern formed by overlapping layers of tiles.

FIG. 5C shows an alternative calibration pattern 590. The calibration pattern 590 is formed by tiling two differently sized tiles across a projected image. Each tile may contain a pseudo-random noise pattern of dots that allows for location of a tile using correlation. A first plane is formed with small tiles as shown by dividing lines 580. A second plane is formed with larger tiles as shown by division lines 585. The two planes are then placed on top of each other and combined to form the calibration pattern 590. A noise pattern used in the tiles is sparse enough that the overlapping planes allows tiles of either plane to be located.

FIG. 5B relates to a method of decoding the calibration pattern 590 of FIG. 5C. The calibration pattern 590 is formed by tiling tile 531 for the first plane and tile 532 for the second plane. To determine the position of an extracted portion within the calibration pattern, a portion of the calibration pattern 590 is correlated with each of the tiles 531 and 532, to determine an offset (shift) for each tile. Any method of correlation know in the art can be used, for example, the DFT-based method described above with respect for FIG. 5A. The separate tile shifts are then combined, to determine an absolute position of the portion within the calibration pattern 590. A known method of combining separate tile offsets (shifts) to form an absolute position is the Chinese Remainder Theorem (CRT).

FIG. 5B illustrates the correlation of the un-warped portion of the calibration chart 590 with each of the tile 531 and the tile 532 used to form the calibration pattern 590. The correlation with each tile determines an x- and y-offset of the un-warped portion of the chart 590 that results in a best match. For example, the correlation of the un-warped portion with the first tile 531 results in an x-offset 541 and a y-offset 542.

If the portion of the pattern 590 being correlated with the tile 531 and tile 532 is not correctly un-warped, one or more of the correlations will not be accurate. Subsequently, when the two determined offsets are combined using the Chinese Remainder Theorem, the resulting absolute position will not be accurate. As with the direct correlation method, described above with reference to FIG. 5A, the extracted portion of a calibration pattern being correctly un-warped is important, so that the portion can be successfully decoded.

This arrangements described relate to using warping or distortion of a projected structured light pattern, captured by a camera or other sensor to reproduce visual content. Warping can be due to many factors, such as differing projector and camera poses, the curvature and deformities of the projection surface, and lens distortion. Many structured light patterns cannot be decoded if the structured light patterns are significantly warped. In particular, pseudo-random dot patterns that are decoded using correlation cannot be decoded if significantly warped. Therefore, many projected structured light patterns must be un-warped to reproduce (project) visual content that has decreased distortion.

The arrangements described relate to projecting offset structured light patterns, thereby providing information that is used to un-warp captured projected patterns. More specifically, the projected pattern is offset by a known amount in units of a projector or calibration pattern. One or more images of non-offset and offset patterns are captured by one or more cameras. At local regions of the captured images, the offset is measured. The offset is used to determine a local scale between the projected pattern and the captured pattern. The local scale is used to determine the vertices of a portion of the image, such that the portion of the image can be un-warped to match the scale of the projected pattern. The un-warped portion is then decoded. In the implementation described, the decoded portion is used reproduce content, for example by aligning multiple projections on a shared projection surface.

Figure 6:
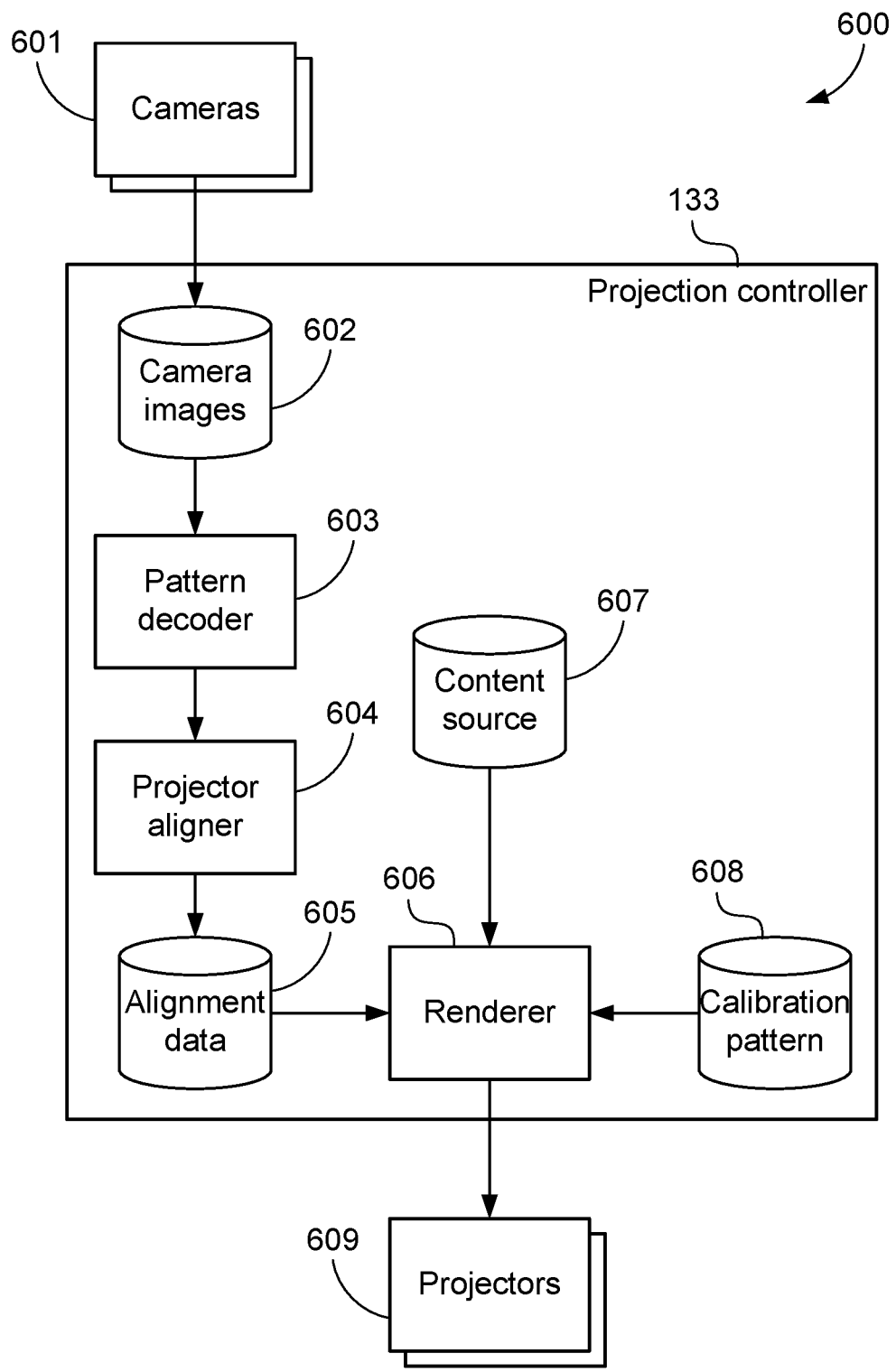
FIG. 6 shows a schematic block diagram of a software architecture for reproducing visual content.

FIG. 6 shows a schematic block diagram of a software architecture 600 associated with application 133 for reproducing visual content. The application 133 executes on the processor 105 to receive captured images of projected calibration patterns from one or more cameras 601 (e.g. the cameras 191 and 192). The application 133 stores the captured camera images 602 in a memory, such as the memory 106. In the example described, the stored images 602 include positive and negative frame images.

The architecture 600 includes a pattern decoder module 603. The pattern decoder module 603 retrieves a corresponding negative frame and positive frame from the stored camera images 602, and creates a subtracted frame, as described with respect to FIG. 5. The pattern decoder module 603 then executes to decode the calibration pattern in the subtracted frame to determine correspondences between positions in the subtracted camera frame and positions in the projected image. The decoding method used by the pattern decoder module 603 depends on the specific calibration pattern used. In one arrangement, the calibration pattern consists of a pseudo-random dot pattern, as described with reference to FIG. 5. The pattern decoder module 603 selects a number of sampling positions within the subtracted frame, determines a portion of the calibration pattern surrounding each sampling position, un-warps the portion of the calibration pattern, and decodes the portion. The operation of the pattern decoder module 603 is described in more detail with reference to FIGS. 10-13.

In another example, the calibration pattern may consist of a regular grid of dots. Once each dot is identified, a corresponding position in the projected image will be known. Other calibration patterns require different decoding methods. For example, a Gray code calibration pattern requires a sequence of frames to be projected and captured. Each frame in the sequence encodes a specific bit within each position of the projected image. The bits are merged over the sequence of frames, resulting in absolute positions in the projected image. Many other calibration patterns and decoding methods are possible, as will be appreciated by a person skilled in the art. The arrangements described are applicable to all calibration patterns which require or benefit from un-warping prior to decoding.

The architecture 600 also comprises a projector aligner module 604. The projector aligner module 604 receives the correspondences formed by the pattern decoder module 603. The projector aligner module 604 determines which portions of the content image should be displayed by each projector, and where in each projector image those portions should be displayed, to achieve precise alignment between the multiple projectors. Aligning the projectors effectively operates to calibrate the projectors for reproducing visual content with decreased distortion. For example, referring to FIG. 2B, the projector aligner module 604 determines that the projector image 231 of the left-side projector 181 should display the left-side portion of the content image 200, within the boundaries of regions 241 and 242 of the projector image 231. Similarly, the projector aligner module 604 determines that the projector image 232 of the right-side projector 182 should display the right-side portion of the content image 200, within the boundaries of regions 243 and 244 of the projector image 232.

The projector aligner module 604 may perform alignment using methods known in the art. For example, the projector aligner module 604 may first use the correspondences formed by the pattern decoder module 603 to triangulate and create a point cloud representation of the projection surface 190. The relative pose of each projector can then be determined, and the point clouds corresponding to the multiple projectors can be combined. The projector aligner module 604 can then determine a region on the surface of the point cloud that is within the maximum projection area, is upright, and has the same aspect ratio as the content image to be displayed or reproduced. Finally, the region can be divided into several portions, to be displayed using the multiple projectors. Alternative methods of performing alignment of multiple projectors may also be used.

The projector aligner module 604 stores alignment data 605, for example in the memory 106. The alignment data 605 consists of data indicating portions of the content image to be reproduced or displayed by each projector. The alignment data 605 also consists of data indicating where in each projector image the portions should be displayed, and how each portion is to be blended, if the portion is within a blend region.

The architecture 600 also includes a renderer module 606. The renderer module 606 executes to receive the alignment data 605, and creates the projector image for each projector. The renderer module 606 retrieves the next content image from a content source 607. The content source 607 may be a static image, a video, or any other form of content. A frame rate of the content images is preferably lower than the frame rate of the projectors and cameras. The renderer module 606 renders the relevant portions of the content image within the regions defined by the alignment data, for each projector image. The renderer module 606 then retrieves a calibration pattern 608, for example from the memory 106. The renderer module 606 embeds the calibration pattern 608 into the projector image, as described with reference to FIG. 3B. The operation of the renderer module 606 is described in more detail with reference to FIGS. 7-9.

The renderer 606 transmits the projector images to projectors 609 (e.g. the projectors 181 and 182) to be rendered or displayed on a projection surface (e.g. the projection surface 190).

Figure 7:
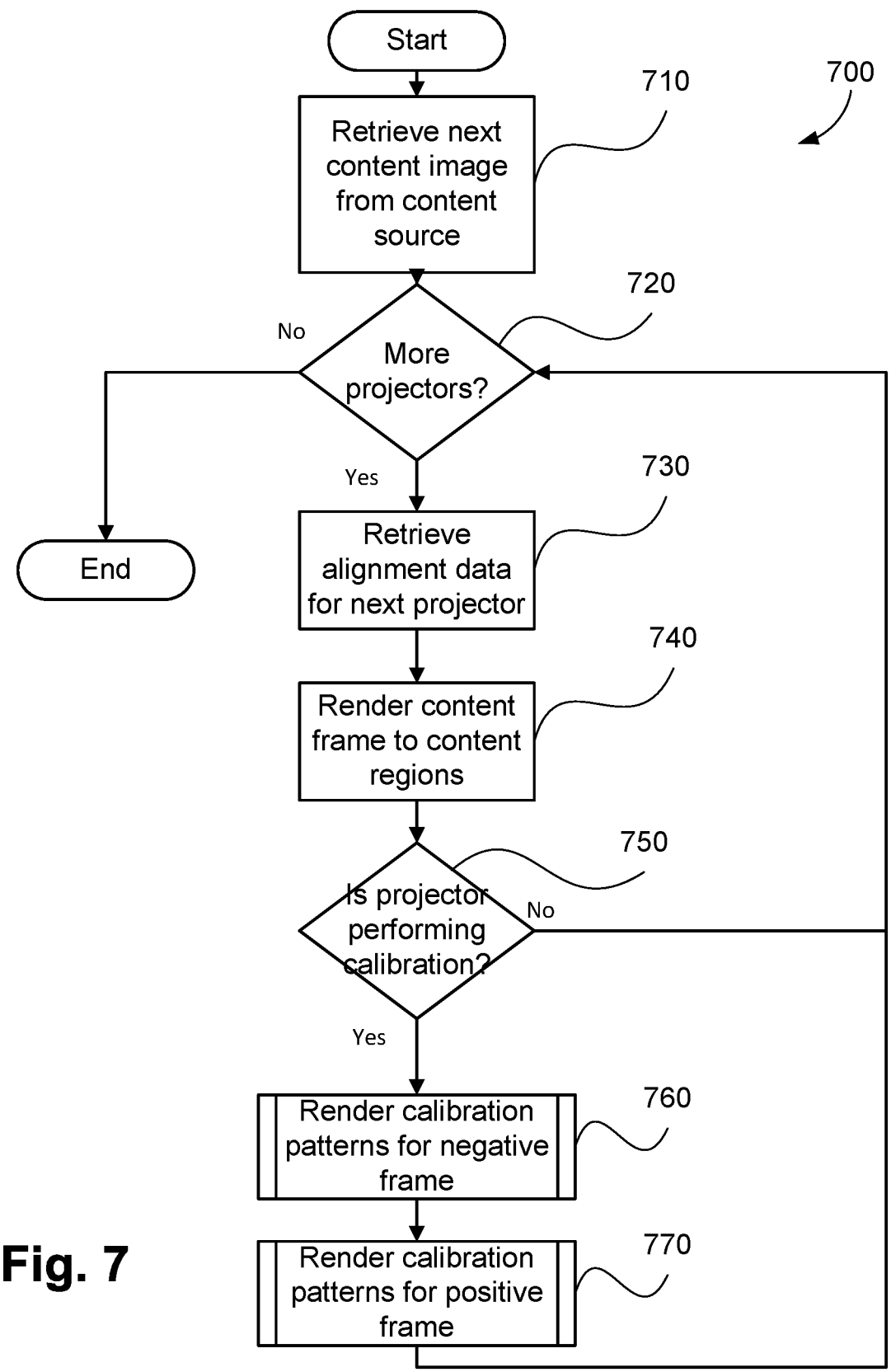
FIG. 7 shows a schematic flow diagram of a method of rendering one or more projected images.

A method 700 of rendering one or more projector images, as executed by the renderer module 606, is hereafter described with reference to FIG. 7. The method 700 is typically implemented as one or more modules of the application 133, controlled under execution of the processor 105, and stored in the memory 106. The method 700 starts at a retrieving step 710. In execution of the step 710, the next content image is retrieved from the content source 607. The method 700 then proceeds under execution of the processor 105 to a decision step 720. The step 720 executes to decide if there are more projectors that require a projector image to be rendered.

If execution of the step 720 determines that there are more projectors that require a projector image to be rendered ("Yes" at step 720), the method 700 proceeds under execution of the processor 105 to a retrieving step 730. At the step 730, the alignment data 605 is retrieved for the next projector. As described above, the alignment data 605 consists of data indicating which portions of the content image are to be displayed by the projector, where in the projector image those portions should be displayed, and how each portion is to be blended, if the portion is within a blend region.

The method 700 proceeds under execution of the processor 105 to a rendering step 740. In execution of step 740, the content image is rendered into the regions of the projector image defined by the alignment data 605. For example, referring to FIG. 2B, the renderer module 606 renders the left-side region of the content image 200 to the regions 241 and 242 of the projector image 231. Since the region 242 is to be blended with the projection of the right-side projector 182, a blend function is applied to region 242. The blend function adjusts the intensity of the projected region, as a function of the position within the region. For example, a blend function applied to the region 242 produces bright pixels on the left edge, and dark pixels on the right edge, with a gradual change from bright to dark, in the direction from left to right. The blend function blends in the opposite direction for region 244, resulting in a seamless transition, from a viewpoint of a user, between the projections in the region 223 on the projection surface 190.

The method 700 proceeds under execution of the processor 105 to a decision step 750. The step 750 executes to decide if the current projector is performing calibration. Preferably, each projector performs calibration at a separate time. Each projector may perform calibration at fixed intervals (e.g. 5 seconds), or when a change to the projector environment is detected (e.g. when one of the projectors is physically moved). When a projector is performing calibration, one or more calibration patterns are projected by the projector, and images of the projected calibration patterns are captured by one or more cameras.

If execution of step 750 determines that the current projector is performing calibration ("Yes" at 750), the method 700 proceeds under execution of the processor 105 to a rendering step 760. In execution of the rendering step 760, the calibration patterns for a negative frame are rendered to the current projector image, resulting in a negative frame. An example of the calibration patterns of a negative frame is described with reference to FIG. 14A.

The method 700 proceeds under execution of the processor 105 from the step 760 to a rendering step 770. At execution of the step 770, the calibration patterns for a positive frame are rendered to the current projector image, resulting in a positive frame. An example of the calibration patterns of a positive frame is described with reference to FIG. 14B. A method 800 of rendering a calibration pattern to a projector image, as performed at steps 760 and 770, is described in more detail hereafter with reference to FIG. 8. Upon completion of the step 770, the method 700 returns under execution of the processor to the step 720.

If execution of step 750 determines that the current projector is not performing calibration, the method 700 returns under execution of the processor 105 to the step 720. If execution of the decision step 720 determines that there are no projectors remaining, the method 700 ends. On the method 700 ending, the renderer module 606 sends the rendered projector images to the corresponding projectors 609.

Figure 8:
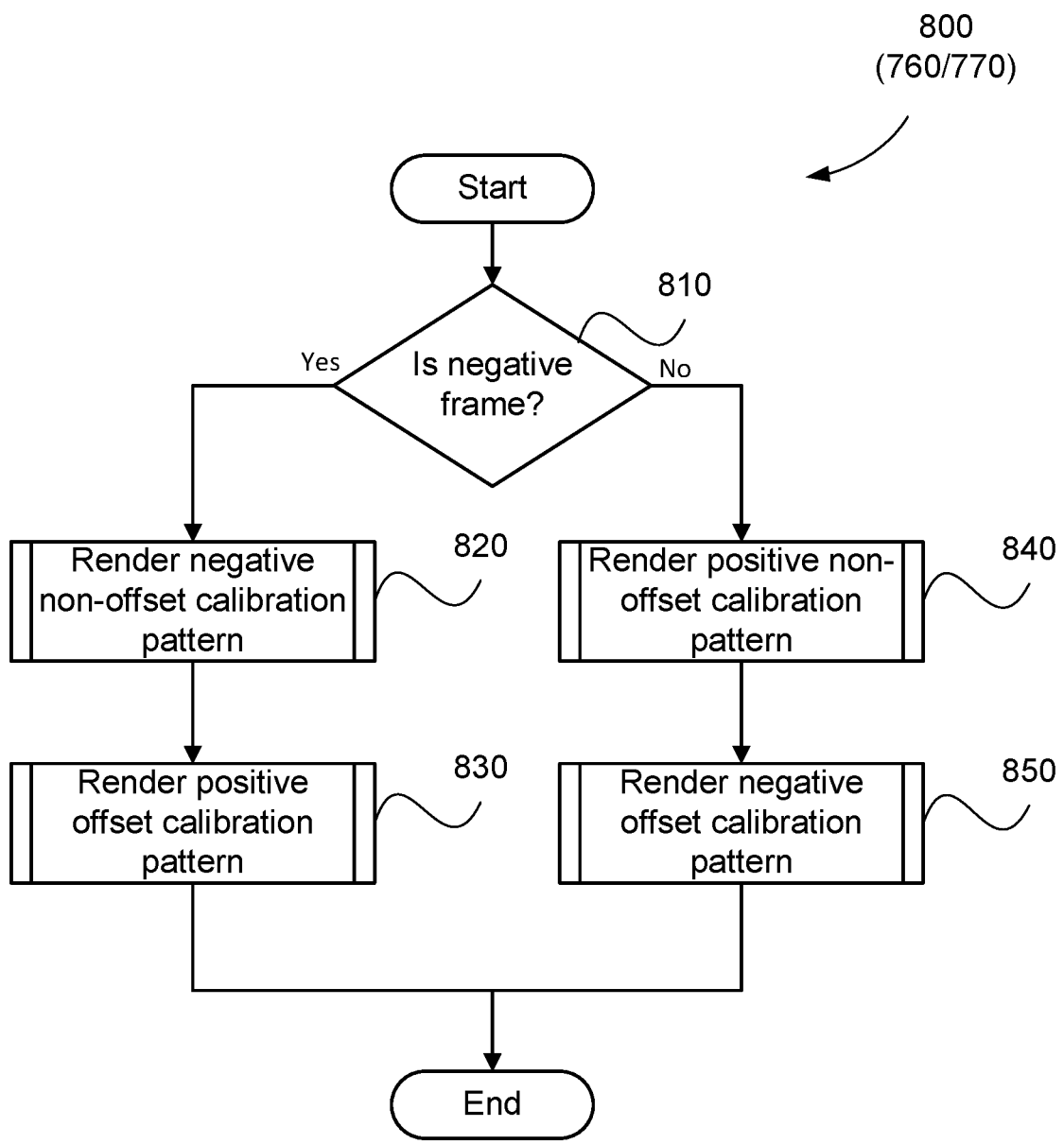
FIG. 8 shows a schematic flow diagram of a method of rendering calibration patterns to a projector image as used in the method of FIG. 7.

The method 800, as executed at steps 760 and 770 of the method 700, of rendering a calibration pattern to a projector image, is now described with reference to FIG. 8. The method 800 is typically implemented as one or more modules of the application 133, for example as the renderer module 606, controlled by execution of the processor 105 and stored in the memory 106.

The method 800 is executed for a current projector image of a current projector that is currently performing calibration. The method 800 starts at a decision step 810. The step 810 executes to determine if the calibration pattern to render is for a negative frame.

The calibration pattern, such as the pattern 301, is preferably embedded in a projected portion of a content image. Preferably, a viewer is not able to perceive the presence of the calibration pattern 301 in the projected image. "Pattern subtraction" is a technique known in the art for making a projected calibration pattern imperceptible. In two consecutive frames of projected content, the calibration pattern 301 is added and subtracted from the intensity values of the projector image by the renderer module 606. A calibration pattern that is "subtracted" from a projected image is known as a "negative calibration pattern". A calibration pattern that is "added" to a projected image is known as a "positive calibration pattern". In the example of FIG. 8, each projected frame contains both a negative calibration pattern and a positive calibration pattern. One of the calibration patterns is an offset calibration pattern. Preferably, a "negative frame" contains a negative non-offset calibration pattern, and a positive offset calibration pattern. Conversely, a "positive frame" contains a positive non-offset calibration pattern, and a negative offset calibration pattern.

If execution step 810 determines that the calibration patterns being rendered to a negative frame ("Yes" at step 810), the method 800 proceeds to a rendering step 820. In execution of the step 820, a negative non-offset calibration pattern is rendered to the projector image. As described above, a negative calibration pattern is subtracted from the projector image, resulting in dark calibration marks. A non-offset calibration pattern is rendered without its calibration marks being offset from their original positions. A non-offset calibration pattern is said to be located at an "initial position".

The method 800 proceeds under execution of the processor 105 from the step 820 to a rendering step 830. At the step 830, a positive offset calibration pattern is rendered to the projector image. As described above, a positive calibration pattern is added to the projector image, resulting in bright calibration marks. An offset calibration pattern is rendered with the pattern's calibration marks being offset or shifted from their initial positions by a certain, typically predetermined, amount. An offset calibration pattern is said to be located at an "offset position". A calibration pattern located at an offset position results in an "offset" calibration pattern, or a "shifted" calibration pattern. Upon completion of the step 830, the negative frame is complete, and the method 800 ends. An example of the calibration patterns rendered into a negative frame is described with reference to FIG. 14A.

If execution of the step 810 determines that the calibration patterns are not being rendered to a negative frame (i.e. it is a positive frame, "No" at step 810), the method 800 proceeds under execution of the processor 105 to a rendering step 840. At execution of the step 840, a positive non-offset calibration pattern is rendered to the projector image. The method 800 proceeds under execution of the processor 105 to a rendering step 850. At execution of the step 850 a negative offset calibration pattern is rendered to the projector image. Upon completion of the step 850, the positive frame is complete, and the method 800 ends. An example of the calibration patterns rendered into a positive frame is described with reference to FIG. 14A.

Thus, in the arrangements described, the non-offset and offset calibration patterns are rendered to the same projected image. Projecting offset and non-offset calibration patterns to the same projected image enables a camera-space offset (shift) to be determined using a single pair of positive and negative frames. The non-offset and offset calibration patterns are rendered with opposite intensities (either positive/negative or negative/positive) so that, in the captured images, the non-offset and offset calibration patterns can be extracted from a single pair of frames. A method of extracting non-offset and offset calibration patterns from captured images is described in more detail with reference to FIG. 10.

Figure 9:
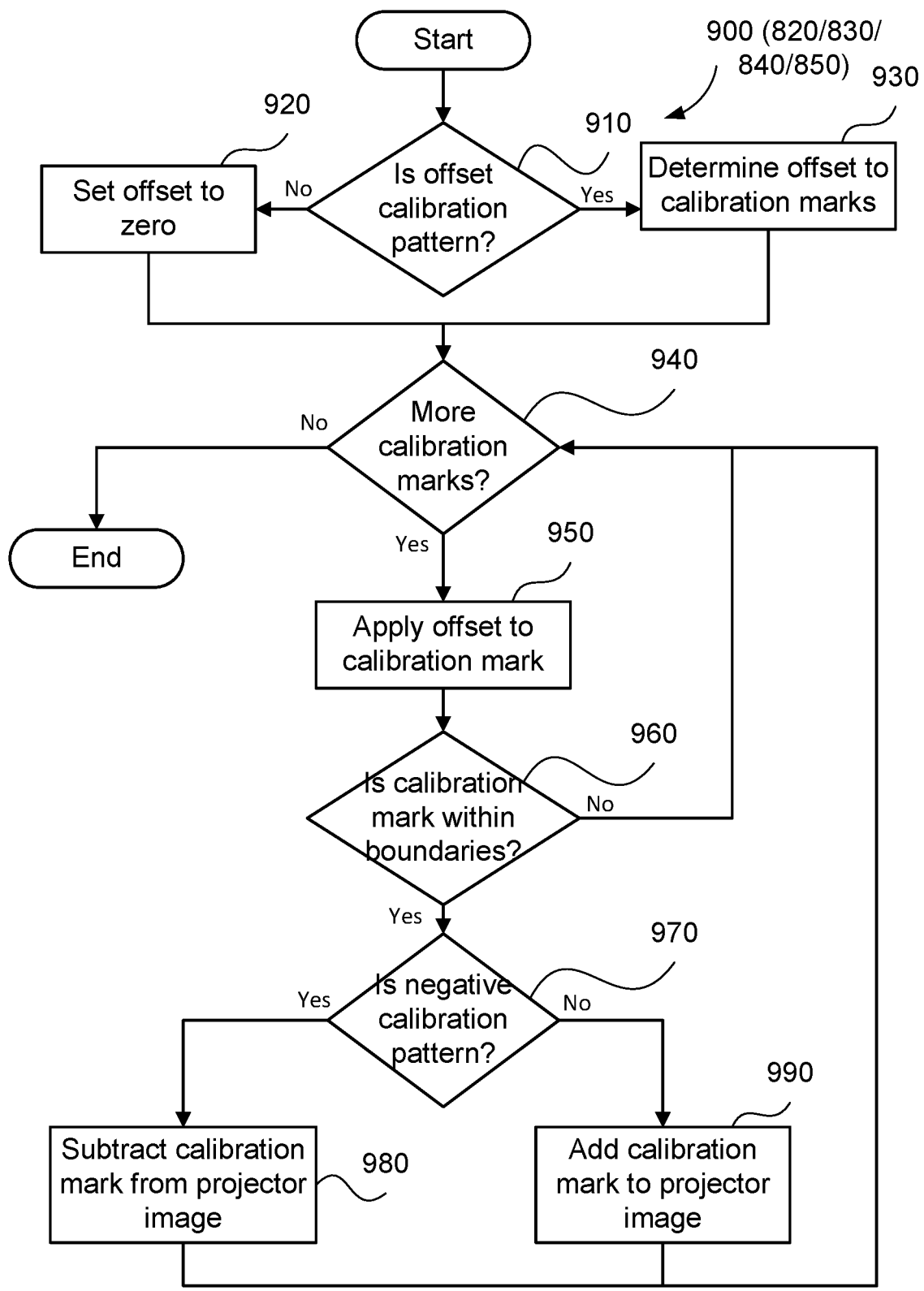
FIG. 9 shows a schematic flow diagram of a method of rendering a single calibration pattern to a projector image as used in the method of FIG. 8.

A method 900 of rendering a calibration pattern, as executed at steps 820, 830, 840 and 850, is described in more detail with reference to FIG. 9.

The method 900, as executed at steps 820, 830, 840 and 850 of the method 800, of rendering a calibration pattern into a projector image is now described with reference to FIG. 9. The method 900 is typically implemented as one or more modules of the application 133, for example as the renderer module 606, controlled by execution of the processor 105 and stored in the memory 106. The method 900 is executed for a current projector image of a projector that is currently performing calibration.

The method 900 starts at a decision step 910. Execution of the step 910 determines if the calibration pattern is an offset calibration pattern. If the calibration pattern is determined not to be an offset calibration pattern (i.e. the calibration pattern is a non-offset calibration pattern, "No" at step 910), the method 900 proceeds to a setting step 920. In execution of the step 920, the offset to apply to the calibration marks is set to (0, 0). The method 900 proceeds under execution of the processor 105 from the step 920 to a decision step 940.

If at the step 910, the application 133 determines that the calibration pattern is an offset calibration pattern, the method 900 proceeds under execution of the processor 105 to a determining step 930. At the step 930, a projection offset to apply to the calibration marks is determined. Preferably, the projection offset is a small multiple of the size of each calibration mark, for example, 1 in the x-direction and 1 in the y-direction. If the offset is too small, the positive marks may obscure the negative marks in the captured images, increasing difficulty in determining the offset in the captured camera images. If the projection offset is too large, a larger region of the captured images will be required to determine the offset in the captured images. The projection offset is used to shift the calibration pattern from an initial position by a predetermined amount.

In a preferred arrangement, offset in the x- and y-directions is identical, in order to accurately locate the positions of the vertices of the portion. An example of applying an offset to rendered calibration patterns and measuring the offset in captured images is described with reference to FIGS. 14-16. In alternative implementations the offset in the x- and y-directions may be different. Different offsets may be used to account for known distortions in the projected image. For example, if the x-direction is warped such that changes in pixel position in the x-direction may not be seen by the camera then the x-direction offset may be increased. Alternatively, if an offset in one direction is not detected in a captured image, the offset may be increased in subsequent projections until the offset is detected. The offset increases can be determined separately for the x- and y-directions.

The method 900 proceeds under execution of the processor 105 from the step 930 to the decision step 940. Execution of the step 940 determines if there are more calibration marks in the calibration pattern remaining to be rendered. As described with reference for FIG. 3A, a calibration pattern typically consists of several calibration marks. For example, the calibration pattern 301, described with reference to FIG. 3A, consists of dot-shaped calibration marks, such as the calibration mark 310.

If execution of the method 900 determines at step 940 that there are more calibration marks remaining to be rendered ("Yes" at the step 940), the method 900 proceeds to an application step 950. In execution of the step 950, an offset is applied to the current calibration mark. Applying an offset to a calibration mark causes the calibration mark to be translated to a new position in x and y. Applying the offset to all calibration marks in the calibration pattern results in an offset calibration pattern. If a non-offset calibration pattern is being rendered, the step 920 will have determined that the offset to apply to the calibration marks is (0, 0) (i.e. zero or no offset).

The method 900 proceeds under execution of the processor 105 from the step 950 to a decision step 960. The step 960 executes to determine if the next calibration mark is within boundaries of regions of the projector image, as defined by the alignment data 605. In a preferred arrangement, calibration marks are only rendered if the calibration marks are within the boundaries of the regions of the projector image, and can therefore more easily be made imperceptible. For example, with reference to FIG. 3, the calibration mark 310 is determined to not be within the boundaries of projector image 321, and is therefore not rendered. If execution of the step 960 determines that the next calibration mark is not within the boundaries of the content image in the current projector image ("No" at the step 960), the method 900 returns to the decision step 940.

If execution of the step 960 determines that the next calibration mark is within the boundaries of the regions of the projector image ("Yes" at the step 960), the method 900 proceeds under execution of the processor 105 to a decision step 970. The step 970 determines if the current calibration pattern is a negative calibration pattern.

If at step 970 the application 133 determines that the calibration pattern being rendered is a negative calibration pattern ("Yes" at step 970), the method 900 proceeds to a subtraction step 980. In execution of the step 980, the calibration mark is subtracted from the projector image. In a preferred arrangement, the intensity of each projector pixel that is overlapped by the calibration mark is reduced by a relatively small, fixed amount. The preferred arrangement results in projected pixels that are darker than surrounding pixels, at the location of the calibration mark. Upon completion of the subtraction step 980, the method 900 returns under execution of the processor 105 to the step 940.

If at step 970 the application 133 determines that the calibration pattern being rendered is not a negative calibration pattern (i.e. "No" at step 970, the calibration pattern is a positive calibration pattern), the method 900 proceeds to an addition step 990. In execution of the step 990, the calibration mark is added to the projector image. In a preferred arrangement, the intensity of each projector pixel that is overlapped by the calibration mark is increased by a small fixed amount. The preferred arrangement results in projected pixels that are brighter than surrounding pixels, at the location of the calibration mark. Upon completion of the addition step 990, the method 900 returns to the step 940.

If, at the decision step 940, the application 133 determines that there are no calibration marks remaining to be rendered, the method 900 ends. Upon the method 900 ending, the calibration pattern has been rendered to a projector image, for reproduction by a projector that is currently performing calibration.

Immediately following the projection or reproduction of each image (including an embedded calibration pattern) onto the projection surface 190, an image of the projected image is captured by one or more cameras. For example, an image (including calibration pattern) is projected by the left-side projector 181, and the projected image is captured by the right-side camera 192. Preferably, a sequence of images containing calibration patterns is projected, as described with reference to FIG. 8. The captured images 602 are stored, and are subsequently decoded by the pattern decoder module 603, thereby forming correspondences between a camera and the projector currently performing calibration.

Figure 10:
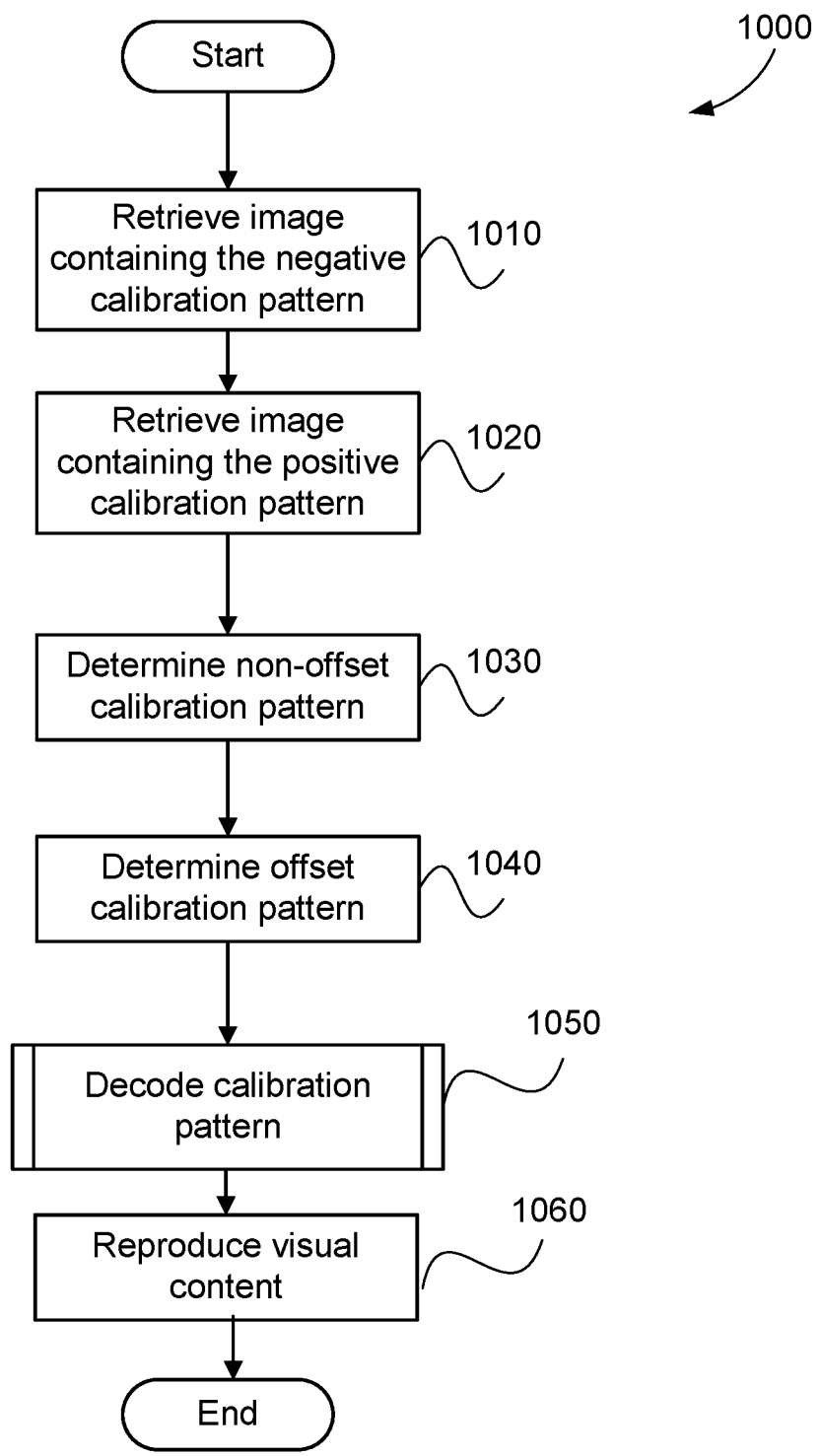
FIG. 10 shows a schematic flow diagram of a method of reproducing visual content.

A method 1000 of reproducing visual content is described with reference to FIG. 10. The method 1000 effectively operates by extracting the calibration patterns from a sequence of captured images, and subsequently decoding the calibration patterns. The method 1000 is typically implemented as one or more modules of the application 133, controlled by execution of the processor 105 and stored in the memory 106.

The method 1000 starts at a retrieving step 1010. In execution of the step 1010, the captured image containing the negative calibration pattern (projected at step 760 of the method 700) is retrieved from the stored camera images 602. As described with respect to FIG. 8, a negative calibration pattern contains a negative non-offset calibration pattern and a positive offset calibration pattern.

The method 1000 proceeds under execution of the processor 105 from the step 1010 to a retrieving step 1020. At the step 1020, the captured image containing the positive calibration pattern (projected at step 770 of process 700) is retrieved from the stored camera images 602. As described with respect to FIG. 8, a positive calibration pattern contains a positive non-offset calibration pattern and a negative offset calibration pattern.

The images retrieved in steps 1010 and 1020 may be referred to as reference images.

In some arrangements, pattern subtraction, i.e., positive and negative frames are not used. Instead, a single reference image, comprising projection of the calibration pattern in initial and offset positions may be captured. In arrangements in which positive and negative frames are not used, step 1020 can be omitted.

The method 1000 proceeds under execution of the processor 105 from the step 1020 to a determining step 1030. At the step 1030, an image of the non-offset calibration pattern is determined by subtracting the image containing the negative calibration pattern from the image containing the positive calibration pattern. The non-offset calibration pattern is said to be located at an "initial position". The subtraction is performed pixel-wise, meaning the intensity of a pixel in the resulting subtracted image is based on the intensities of the corresponding pixels in the positive and negative calibration pattern images. An example of forming an image of the non-offset calibration pattern is described with reference to FIG. 15.

The method 1000 proceeds under execution of the processor 105 from the step 1030 to a determining step 1040. In execution of the step 1040, an image of the offset calibration pattern is determined by subtracting the image containing the positive calibration pattern from the image containing the negative calibration pattern. The offset calibration pattern is said to be located at an "offset position", having a "projected offset" from the initial position. As at the step 1030, the subtraction is performed pixel-wise. An example of forming an image of the offset calibration pattern is described with reference to FIG. 15. The subtracted images determined at steps 1030 and 1040 can be referred to as reference images.

In arrangements in which separate positive and negative frames are not used, the steps 1030 and 1040 relate to selecting the single frame to use as both the non-offset calibration pattern and the offset calibration pattern (i.e. no subtraction is performed). In later steps, particularly with respect to a method 1200 (FIG. 12), the spatial offset is determined within the single frame containing both the non-offset calibration pattern and the offset calibration pattern.

The method 1000 proceeds under execution of the processor 105 from the step 1040 to a decoding step 1050. At the step 1050, the images of the non-offset and offset calibration patterns are used to decode the calibration pattern. A method of decoding the calibration pattern is described in more detail with reference to FIG. 11.

The method 1000 proceeds under execution of the processor 105 from the step 1050 to a reproducing step 1060. The reproducing step 1060 executes to align the projectors 181 and 182 and reproduce the content image 200 by projection. The reproducing step effectively calibrates the projectors 181 and 182 to reproduce the content image 200 without distortion or at least with decreased distortion.

As described with reference to FIG. 6, the projector aligner module 604 receives the correspondences formed by the pattern decoder module 603, and aligns the projection of the two or more projectors on the projection surface 190 using the determined position. To perform alignment, the projector aligner module 604 accordingly uses at least the determined spatial capture offset, scale, and the position of the de-warped portion.

The method 1000 ends upon completion of the reproducing step 1060.

Figure 11:
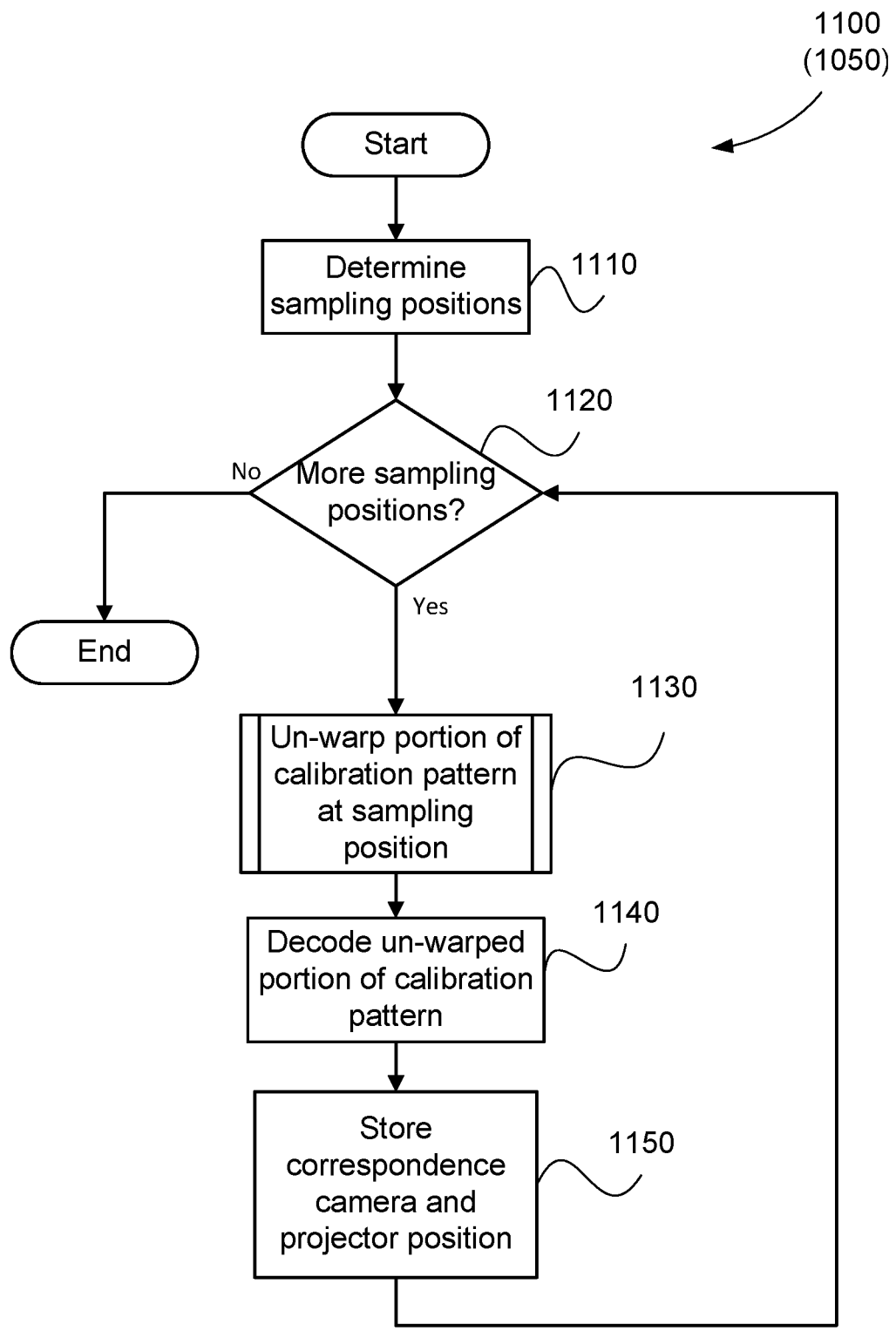
FIG. 11 shows a schematic flow diagram of a method of decoding an extracted calibration pattern as used in the method of FIG. 10.

A method 1100 of decoding a captured calibration pattern, as executed at step 1050 of the method 1000, is now described with reference to FIG. 11. The method 1100 is typically implemented as one or more modules of the application 133, controlled by execution of the processor 105 and stored in the memory 106.

The method 1100 starts at a determining step 1110. At the step 1110, the sampling positions in the captured (reference) camera images are determined. Sampling positions can be determined using any method known in the art, including regular grid positions, and positions based on successfully decoded points in a previous calibration. Preferably, sampling positions are determined at regular, evenly-spaced positions in the captured camera images.

The method 1100 proceeds under execution of the processor 105 from the step 1110 to a decision step 1120. At the step 1120, the application 133 determines if there are more sampling positions at which to attempt to decode the captured calibration patterns. If the step 1120 determines that there are more sampling positions ("Yes" at step 1120), the method 1100 proceeds to an un-warping step 1130. At the step 1130 a portion of the calibration pattern surrounding the next sampling position is un-warped. A method of un-warping a portion of a captured calibration pattern will be described with reference to FIG. 12.

The method 1100 proceeds under execution of the processor 105 to a decoding step 1140. In execution of the step 1140, the image portion that was un-warped (de-warped) at step 1130 is decoded, to determine a position within the calibration pattern. The decoding performed at step 1140 is specific to the type of calibration pattern that is projected. Preferably, the projected calibration pattern is a pseudo-random dot pattern. Therefore, a correlation-based decoding method is suitable. A correlation-based decoding method typically correlates the un-warped (de-warped) portion with one or more pseudo-random dot patterns of the calibration pattern. Two forms of correlation-based decoding were described above, with reference to FIG. 5.

The result of the decoding step 1140 is a position in the projected calibration pattern that corresponds to the current sampling position in a captured camera image. Therefore, the decoding step 1140 establishes a correspondence between the sampling position in the captured camera image and a position in a projected image. The captured camera image at steps 1130 and 1140 may be one of the previously captured reference images retrieved at step 1010 or step 1020, or to one of the resultant images determined at steps 1030 and 1040. Alternatively, the captured image of step 1140 may relate to a different image captured using one of the cameras 191 and 192 and including the same calibration pattern as the images from steps 1010 and 1020. For example, the images of steps 1030 and 1040 may relate to test images that are relatively simple in comparison to a more complex image. The projected image relates to the stored visual content and the calibration pattern which are to be reproduced using the projectors 181 and 182.

The method 1100 proceeds under execution of the processor 1100 from the step 1140 to a storing step 1150. At step 1150 of the method 1100, the correspondence between the sampling position in the captured camera image and a position in the projected image is stored, so that the correspondence can be used by the projector aligner 604 module to align the multiple projectors for reproducing content.

Upon completion of the storing step 1150, the method 1100 returns under execution of the processor 105 to the decision step 1120. If, at the decision step 1120, the application 133 determines that there are no more sampling positions ("No" at 1120), the method 1100 ends. At the end of the method 1100, the calibration pattern has been decoded.

Figure 12:
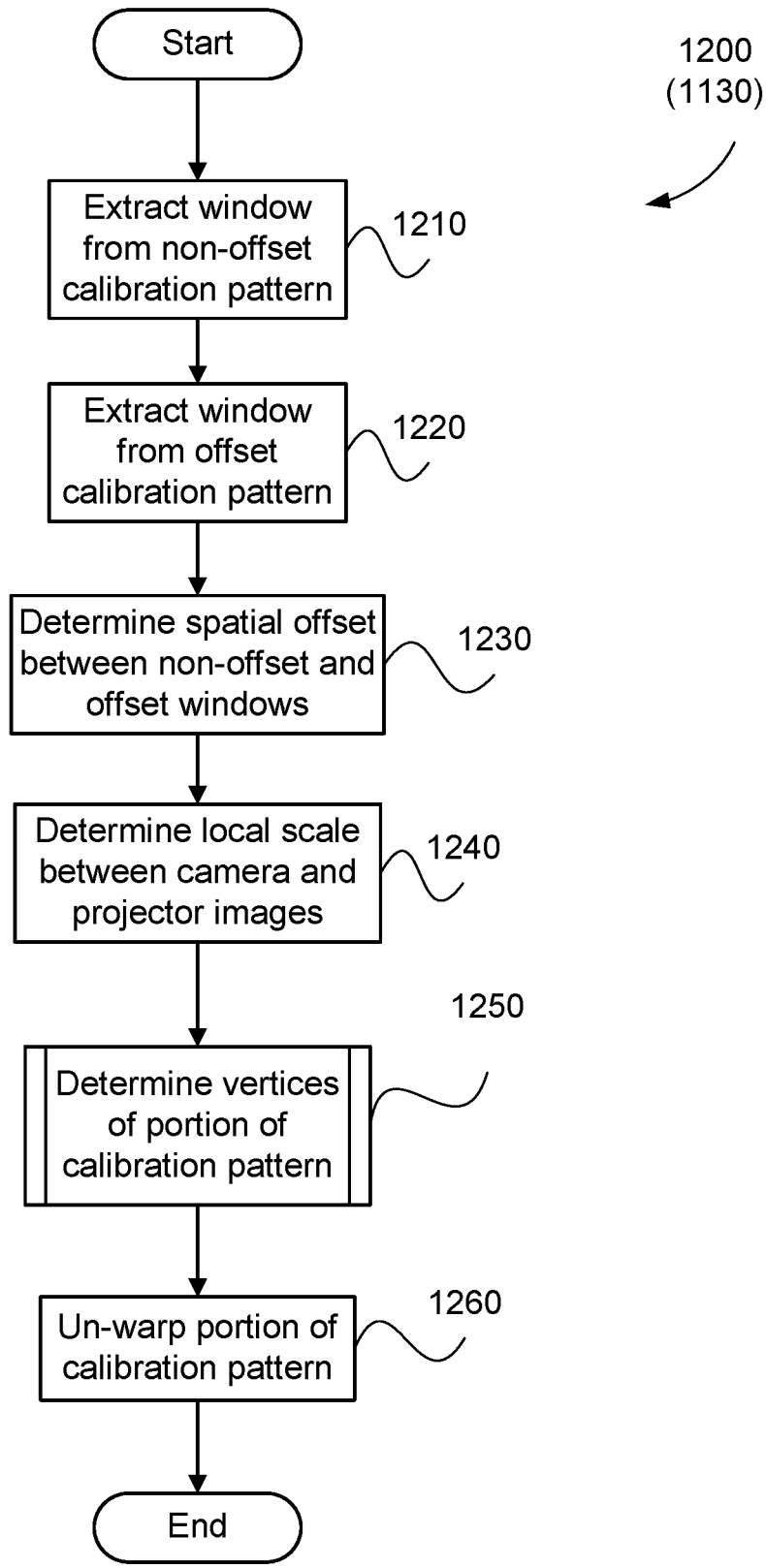
FIG. 12 shows a schematic flow diagram of a method of de-warping a warped portion of a calibration pattern as used in the method of FIG. 11.

A method 1200 of un-warping a portion of a captured calibration pattern, as executed at step 1130 of the method 1100, is now described with reference to FIG. 12. The method 1200 is typically implemented as one or more modules of the application 133, controlled by execution of the processor 105 and stored in the memory 106.

Figure 16A:
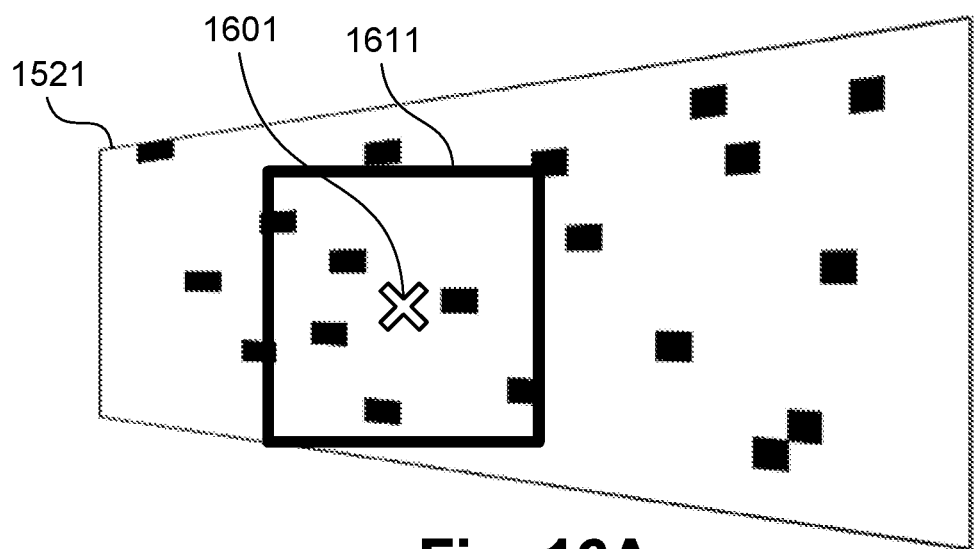
FIG. 16A shows an example of determining a non-offset window at a sampling position in a non-offset calibration pattern.

The method 1200 starts at an extracting step 1210. In execution of the step 1210, a window within the subtracted non-offset calibration pattern (a "non-offset window"), centred on the current sampling position, is extracted. Extracting the window involves copying the pixels within the window to an image of a same size as the window. The size of the window depends on factors such as the size of each calibration mark, the density of calibration marks, the required accuracy, and the degree of warping that is expected. Typically, the window is large enough to include as many calibration marks as possible, while being small enough that the calibration pattern within the window is not significantly distorted. An example of a window in a captured non-offset calibration pattern is shown in FIG. 16A.

Figure 16B:
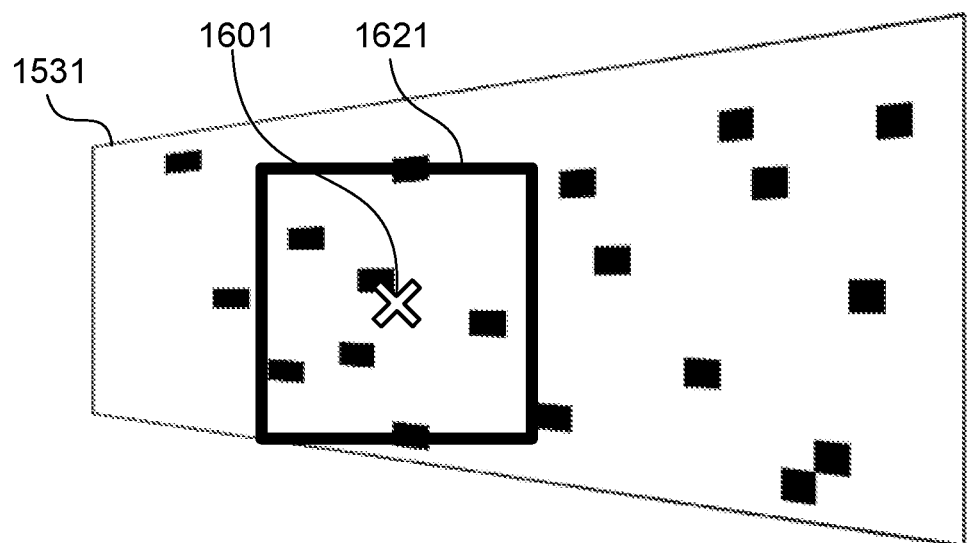
FIG. 16B shows an example of determining an offset window at a sampling position in an offset calibration pattern.

The method 1200 proceeds under execution of the processor 105 from the extracting step 1210 to an extracting step 1220. In execution of the step 1220, a similar window is extracted from the captured offset calibration pattern (an "offset window") as at the step 1210. The window used at step 1220 is typically the same size as the window used at step 1210. The window is located at the same position as the window used at step 1210, centred at the current sampling position. The pixels within the window used at the step 1220 are copied to an image of the same size as the window used at the step 1210. An example of a window in a captured offset calibration pattern is shown in FIG. 16B.

In arrangements where pattern subtraction is not used, the steps 1210 and 1220 relate to extracting windows from a single reference image.

The method 1200 proceeds under execution of the processor from the step 1220 to a determining step 1230. At the step 1230, a spatial capture offset is determined between the non-offset and offset windows extracted at the steps 1210 and 1220. The spatial capture offset represents a measure of the spatial shift of the calibration pattern, between the initial position (non-offset position) and the offset position. The spatial capture offset measures a spatial shift of the calibration pattern in the reference images. The spatial capture offset is determined by comparing (correlating) a window within the non-offset calibration pattern with a window within the offset calibration pattern. The spatial capture offset is typically determined using a correlation method, as described with reference to FIG. 5. Correlation determines the translation (in x and y) of the non-offset window that results in the closest pixel-wise match with the offset window. Therefore, correlation determines the offset (shift) between the non-offset window and the offset window. An example of determining the offset is described with reference to FIG. 16.

The method 1200 proceeds under execution of the processor 105 from the step 1230 to a determining step 1240. At the step 1240, a local scale between the captured camera image and the projected image, at the location of the current sampling point, is determined. The local scale is a ratio between the spatial capture offset in the captured image, as determined at step 1230, and the offset in the projected images (the projection offset), the offset in the projected images being known and uniform throughout the projected image. The local scale is accordingly determined using the spatial capture offset and the projection offset. Preferably, the local scale is determined separately in the x- and y-directions. In one arrangement, the local scale (in either x or y) is determined by dividing the offset (in x or y) determined at step 1230 by the offset (in x or y) in the projected image (determined at step 930 of the method 900). The local scale represents a relationship between distance (in units of camera pixels) in the captured images and distance (in units of projector pixels, or calibration pattern units) in the projected images.

The method 1200 proceeds under execution of the processor 105 from the step 1240 to a determining step 1250. In execution of the step 1250, the local scale determined at step 1240 is used to determine vertices of a portion of the captured calibration pattern. Subsequently, the vertices can be used to un-warp (de-warp) the portion of the image. When the portion of the calibration pattern is transformed to an un-warped portion, the un-warped portion can be used to successfully decode the calibration pattern. Step 1250 therefore defines how to un-warp the portion of the calibration pattern surrounding the sampling position. A method 1300 of determining the vertices of the portion is described in more detail with reference to FIG. 13.

The method 1200 proceeds under execution of the processor 105 from the step 1050 to an un-warping step 1260. At the step 1260, the determined vertices of the portion, as determined from the scale at step 1250, are used to un-warp (de-warp) the portion. Preferably, each of the determined vertices maps to a vertex of an un-warped portion. A perspective transform is determined. The perspective transform maps between the warped portion and the un-warped portion. The perspective transform is used to transform the pixels within the warped portion to the pixels within the un-warped portion. An example of un-warping a portion of the calibration pattern, as performed by step 1260, is described with reference to FIG. 18. The method 1200 ends upon completion of the step 1260.

Figure 13:
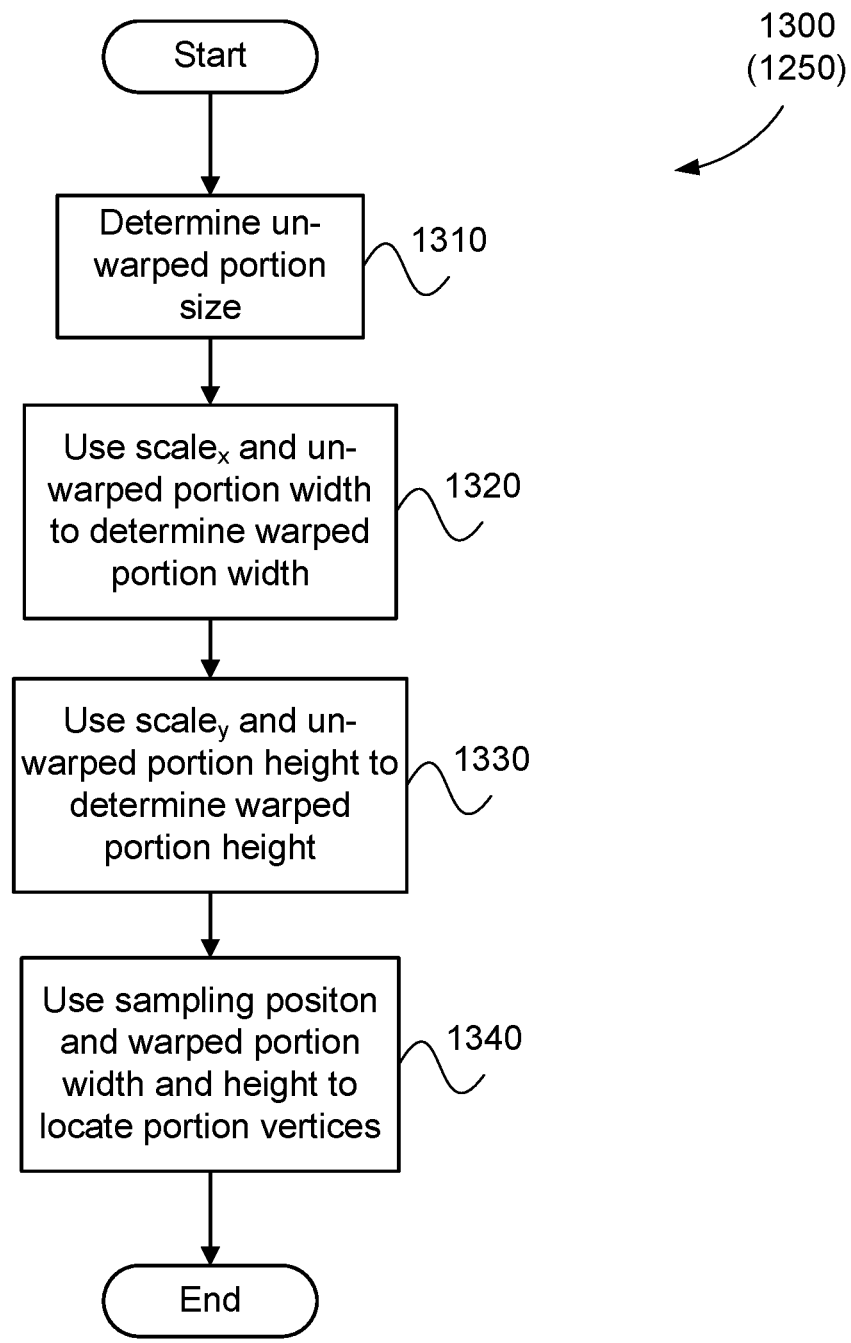
FIG. 13 shows a schematic flow diagram of a method determining the vertices of a warped portion of a calibration pattern as used in the method of FIG. 12.

The method 1300 of determining the vertices of a warped portion of a captured calibration pattern, as executed at step 1250 of the method 1200, is now described with reference to FIG. 13. The method 1300 is typically implemented as one or more modules of the application 133, controlled by execution of the processor 105 and stored in the memory 106.

The method 1300 starts at a determining step 1310. At the step 1310, the size of the un-warped portion is determined. Preferably, the un-warped portion is a square-shaped image with an equal width and height. As described above, the size of the un-warped portion should be chosen such that correlation can be performed reliably to determine the offset between the non-offset and offset calibration patterns.

The method 1300 proceeds under execution of the processor 105 from the step 1310 to a determining step 1320. At the step 1320, the scale in the x-direction (determined at step 1240 of the method 1200) is used to determine the width of the warped portion. In a preferred embodiment, the scale in the x-direction is multiplied by the width of the un-warped portion. Multiplying the scale in the x-direction by the width of the unwarped portion produces the width of the warped portion in the camera image. An example of determining the width of the warped portion is described with reference to FIG. 17.

The method 1300 proceeds under execution of the processor 105 from the step 1320 to a determining step 1330. At the step 1330, scale in the y-direction (determined at step 1240 of the method 1200) is used to determine the height of the warped portion. In the preferred embodiment, the scale in the y-direction is multiplied by the height of the un-warped portion. Multiplying the scale in the y-direction by the height of the unwarped portion calculation produces the height of the warped portion in the camera image. An example of determining the height of the warped portion is described with reference to FIG. 17.

The method 1300 proceeds under execution of the processor 105 to a locating step 1340. In execution of the step 1340, the determined width and height of the warped portion are used to determine the vertices of the warped portion. In a preferred arrangement, there are four vertices, defining a quadrilateral that bounds the warped portion of the captured calibration pattern. The vertices are determined such that sampling position is in the centre of the quadrilateral, and the quadrilateral has the width and height determined at steps 1320 and 1330, respectively. Step 1340 accordingly relates to determining a spatial location in the calibration pattern, being the sampling position. An example of determining the vertices of the warped portion is described with reference to FIG. 17. When the image portion bound by the defined quadrilateral is transformed to the un-warped portion dimensions, the image portion can be successfully decoded. In other arrangements, the vertices can relate to a polygon.

An example of negative and positive rendered calibration patterns is now described with reference to FIGS. 14A and 14B. The method of rendering calibration patterns was described above with reference to FIG. 7 to FIG. 9. The example calibration patterns would usually be added to or subtracted from a content image, as described above. In the FIGS. 14-20, the content image is not shown, to better illustrate the arrangements described. In FIGS. 14-20 the size of the example calibration marks is exaggerated, in order to better demonstrate the methods described. Typically, calibration marks are small, such as those shown in FIG. 3 and FIG. 4.

Figure 14A:
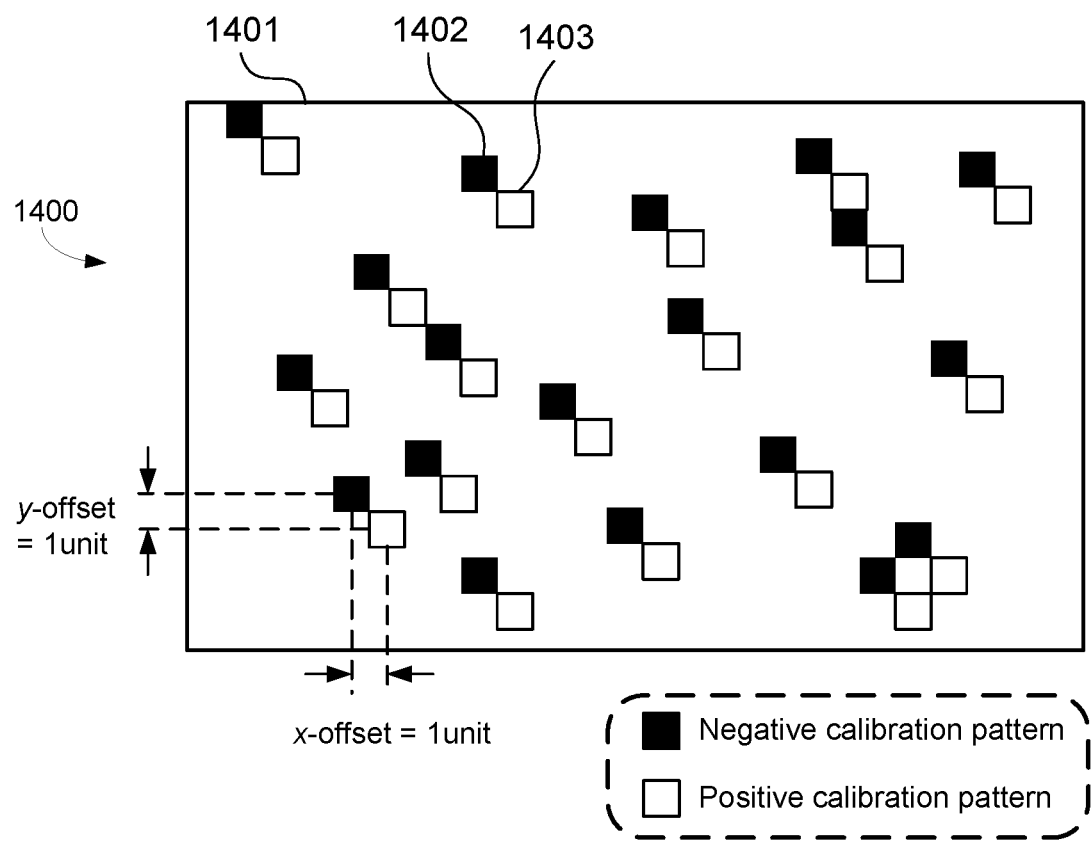
FIG. 14A shows an example of a projected negative.

FIG. 14A shows an example 1400 of calibration pattern 1401 rendered to a negative frame, as performed at steps 820 and 830 of the method 800. Negative marks of the calibration pattern 1401 are shown as black squares (e.g. square 1402), and positive marks of the calibration pattern 1401 are shown as white squares (e.g. square 1403). Each square represents a single calibration mark. The negative calibration marks are rendered at step 820, and the positive calibration marks are rendered at step 830, of the method 800.

As shown in FIG. 14A, the positive calibration pattern is offset from the negative calibration pattern. For example, positive calibration mark 1403 is offset from the corresponding negative calibration mark 1402. In the example of FIG. 14A, the offset (determined at step 930 of the method 900) is 1 unit in the x-direction, and 1 unit in the y-direction, in units of calibration marks (the origin is at the top-left corner of the calibration pattern 1401). Offsetting establishes a fixed known distance between corresponding calibration marks throughout the projected image.

Figure 14B:
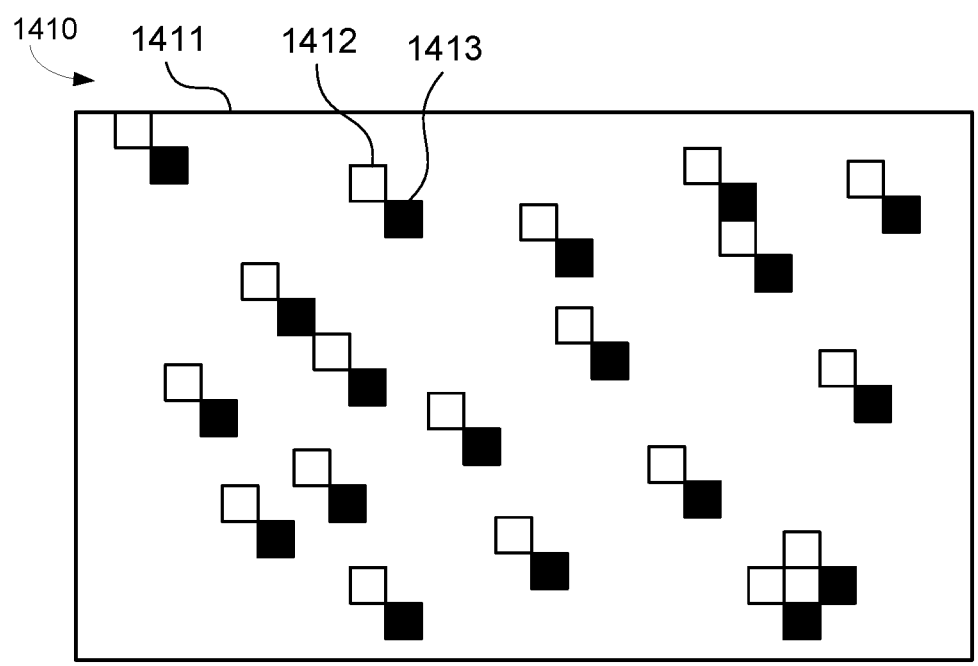
FIG. 14B shows an example of a projected positive frame.

FIG. 14B shows an example 1410 of a calibration pattern 1411 rendered to a positive frame, as performed at steps 840 and 850 of the method 800. The pattern 1411 corresponds to the pattern 1410. As with the negative frame of FIG. 14A, the positive frame of FIG. 14B contains both a negative calibration pattern and a positive calibration pattern. However, the non-offset calibration pattern is a positive calibration pattern, consisting of positive calibration marks (e.g. calibration mark 1412), and the offset calibration pattern is a negative calibration pattern, consisting of negative calibration marks (e.g. calibration mark 1413).

The calibration pattern 1411 has the same offset as the calibration pattern 1401 in the negative frame of FIG. 14A. Using the same offset for positive and negative frames ensures that, when the calibration patterns are added to or subtracted from the content images, an average of the positive and negative frame at any projected pixel is equal to the content pixel. Using the same offset for positive and negative frames accordingly ensures that the calibration patterns are imperceptible when observed by a viewer of a projected image. Using the same offset for positive and negative frames also means that the non-offset and offset calibration patterns can be extracted from each pair of captured images using frame subtraction, as described with reference to FIG. 10.

FIG. 15A(1) shows a captured negative frame 1501 and FIG. 15A(2) a captured positive frame 1511. The captured negative frame 1501 is captured, for example, by the right-side camera 192 when the left-side projector 181 is projecting or reproducing the negative frame 1401. Similarly, the captured positive frame 1511 is captured by the right-side camera 192 when the left-side projector 181 is projecting the positive frame 1411.

FIGS. 15B(1) and 15B(2) show subtracted frames 1521 and 1531 produced by steps 1030 and 1040, respectively, of the method 1000, as described with reference to FIG. 10. The subtracted frame 1521 is produced by subtracting corresponding pixels from the captured negative frame 1501 from the captured positive frame 1511. Any subtracted pixels with an intensity less than zero are set to zero. Therefore, the subtracted frame 1521 contains only calibration marks from the non-offset calibration pattern. Further, the image of the projection surface and any projected content are removed through the subtraction process, thereby isolating those calibration marks from the non-offset calibration pattern. Similarly, the subtracted frame 1531 is produced by subtracting corresponding pixels from the captured positive frame 1511 from the captured negative frame 1501. Any subtracted pixels with an intensity less than zero are set to zero. Therefore, the subtracted frame 1531 contains only calibration marks from the offset calibration pattern.

The captured frames 1501 and 1511, and accordingly the subtracted frames 1521 and 1531, are warped in comparison with the projected frames 1401 and 1411, as a result of the different pose of the left-side projector 181 and the right-side camera 192. Decoding the calibration patterns embedded in the subtracted frames 1521 and 1531 is accordingly difficult. The arrangements described are configured to un-warp local regions of the subtracted frames 1521 and 1531, so that the calibration pattern can be decoded.

The arrangements described of determining the local shift using a captured non-offset and offset calibration pattern are now described with reference to FIGS. 16A-16C. FIG. 16A shows a sampling position 1601 within a subtracted frame containing the non-offset calibration pattern 1521.

FIG. 16B shows the same sampling position 1601 within a subtracted frame containing the offset calibration pattern 1531. The arrangements described relate to a method to un-warp the portion of the non-offset calibration pattern 1521 (or alternatively, the offset calibration pattern 1531) surrounding sampling position 1601, so that the calibration pattern can be decoded, and a corresponding projector position can be found for the camera sampling position 1601.

At step 1210 of the method 1200, a window 1611 (FIG. 16A) is extracted from the non-offset calibration pattern 1521. Similarly, at step 1220 of the method 1200, a window 1621 (FIG. 16B) is extracted from the offset calibration pattern 1531. As described above, windows 1611 and 1621 are the same size, and are at the same position in the respective subtracted images.

Figure 16C:
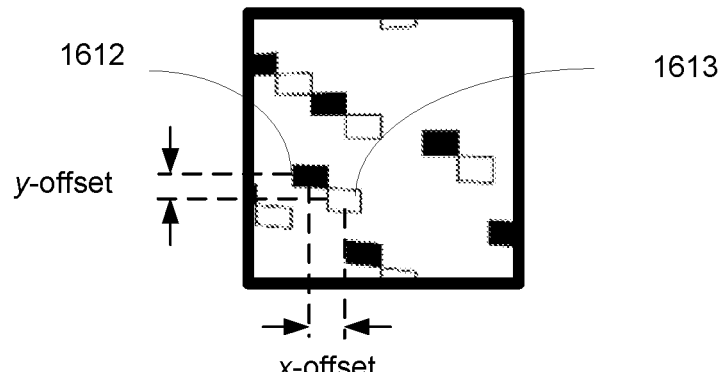
FIG. 16C shows an example of determining a local offset (shift) at a sampling position using the example windows shown in FIG. 16A and FIG. 16B.

FIG. 16C shows contents of the window 1611 of the non-offset calibration pattern 1521 overlaid with the contents of the window 1621 of the offset calibration pattern 1531. The non-offset calibration marks are shown in black filled rectangles (for example the rectangle 1612), and the offset calibration marks are shown in white unfilled rectangles (for example a rectangle 1613). FIG. 16C shows that the captured non-offset and offset calibration marks have been warped, in comparison with the projected non-offset and offset calibration marks (1402, 1403, 1412, 1413) shown in FIGS. 14A and 14B. The x-offset and y-offset has also changed, as a result of the warping when compared to the corresponding offsets in FIG. 14A. Using the correlation methods described with reference to step 1230 of the method 1200, the values of the x-offset and y-offset, in camera pixels, can be determined.

An example of determining the vertices of a warped portion of a captured calibration pattern, as performed by the method 1300, is now described with reference to FIGS. 17A and 17B. FIG. 17A(1) shows an un-warped portion 1701, being a rectangle with an equal width, $w_u$, and height, $h_u$, as determined at step 1310 of the method 1300. FIG. 17A(2) shows how vertices of a warped portion 1711 are determined. As shown, the portion 1711 is centred on the sampling position 1601. A width, $w_w$, and height, $h_w$, of the warped portion 1711 are determined by multiplying with width, $w_u$, and height, $h_u$, of the un-warped portion by the scale in a corresponding one of the x- and y-directions ($scale_x$ and $scale_y$), respectively. The positions of the vertices are then determined by adding or subtracting half of the width, $w_w$, or height, $h_w$, to or from the sampling position coordinates, as appropriate. The method of determining the vertices of the un-warped portion was described with reference to steps 1320, 1330 and 1340 of the method 1300.

FIG. 17B shows the warped portion 1711 overlaid onto the captured non-offset calibration pattern 1521, centred on the sampling position 1601.

Figure 18A:
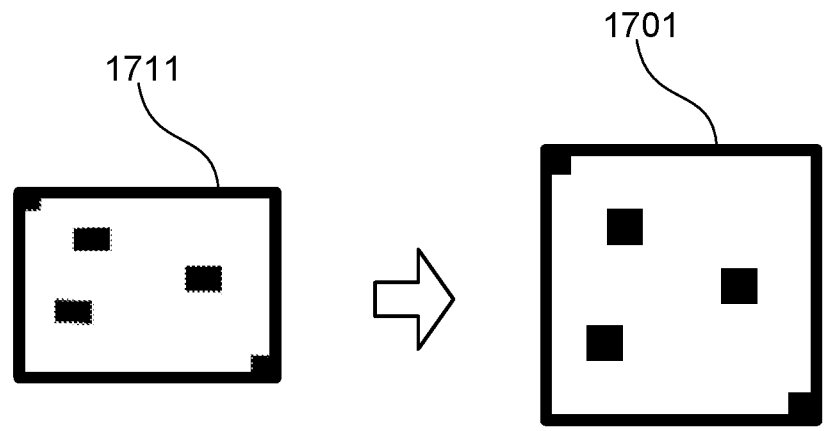
FIG. 18A shows an example of un-warping a warped portion of a calibration pattern.

FIG. 18A shows an example of the un-warping of the portion 1711 of the captured calibration pattern 1521, to form the un-warped portion 1701. The process of un-warping a warped portion was described with reference to step 1260 of the method 1200. The warped portion of the image is transformed such that the transformed portion is of the same size as the un-warped portion 1701. As shown in the example of FIG. 18A, the un-warping process has effectively un-warped the warped calibration pattern, so that the un-warped pattern closely resembles the projected calibration pattern 1401.

Figure 18B:
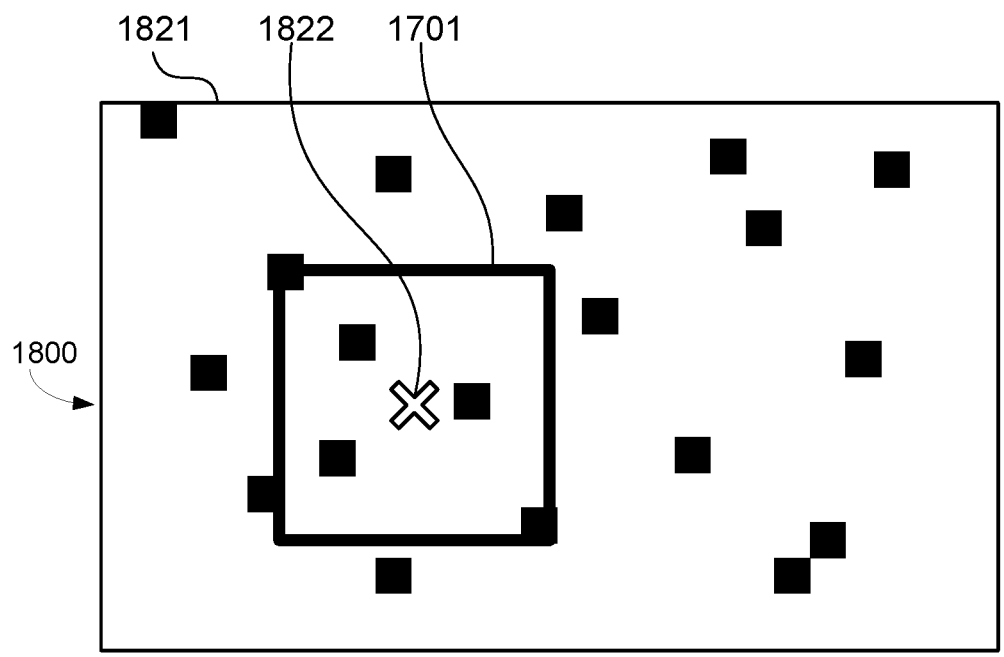
FIG. 18B shows an example decoding the un-warped portion shown in FIG. 18A.

FIG. 18B shows a result 1800 of the decoding process, based on the un-warped portion 1701. The decoding method was described hereinbefore with reference to FIG. 5. For example, using correlation methods known in the art, the un-warped portion 1701 is correlated with a non-offset calibration pattern 1821, and a position 1822 within the calibration pattern 1821 is found. Thus, a correspondence is formed between the camera image sampling position 1601 and the projector image position 1822.

Alternatively, instead of un-warping the captured portion to match the projected portion at step 1260, the projected portion can be warped by the application 133 using the scale to match the captured portion. The matching captured and projected portions can be correlated by the application 133 to determine the position within the captured calibration pattern that corresponds with the projected portion.

In arrangements described above, a single offset calibration pattern is projected. Projecting a single calibration pattern allows local scale to be determined between the captured calibration pattern and the projected calibration pattern, but only in the direction of the offset. Therefore, the warped portion determined by the method 1300 is limited to an upright rectangle. In many scenarios, such as when the projection surface 190 is curved or when there is lens distortion in one or more of the projectors, projecting a single calibration pattern will not allow the warped portion to be un-warped with sufficient accuracy. The resulting un-warped portion accordingly may not be decoded successfully.

In a further arrangement, additional calibration patterns are projected and captured. The additional calibration patterns consist of a non-offset calibration pattern, and an additional offset calibration pattern, the additional offset calibration pattern at an additional projection offset position. Preferably, the additional projection offset position is in a different direction from the initial position than the original offset position. As with the original offset calibration pattern, the additional offset calibration pattern is shifted in the direction of the additional offset position.

At each sampling position, an additional spatial captured offset is then determined, using captured images of the non-offset calibration pattern and the additional offset calibration pattern. The additional spatial capture offset is therefore an offset between the initial position and the additional offset position, in units of camera pixels. An additional scale is determined, using the additional spatial capture offset and the additional projection offset, in a manner similar to the original spatial capture offset and projection offset. The determined additional scale is used, in conjunction with the original determined scale, to locate the vertices of the warped portion, and to de-warp the portion.

Figure 19A:
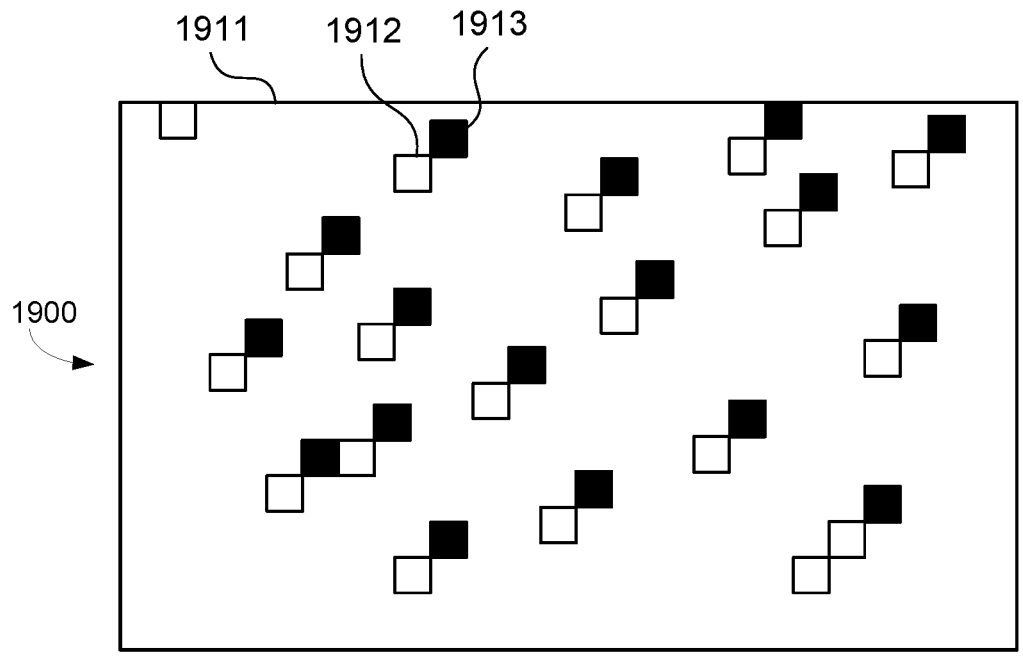
FIG. 19A shows an example of projecting an additional calibration pattern in an additional offset direction.

FIG. 19A shows an example 1900 of a second calibration pattern 1911 that is offset in a direction orthogonal to the offset direction shown in FIG. 14B. It is not necessary that the offset directions are orthogonal, only that the offset directions are different. Only the positive frame is shown in FIG. 19A for ease of reference. The positive frame 1900 would typically be accompanied by a negative frame. The offset calibration pattern of FIG. 19A (indicated by black calibration marks, e.g. 1913) is to the top-right of the corresponding non-offset calibration pattern (indicated by white calibration marks, e.g. 1912). In contrast, in FIG. 14B, the offset calibration pattern is to the bottom-right of the non-offset calibration pattern.

Figure 19B:
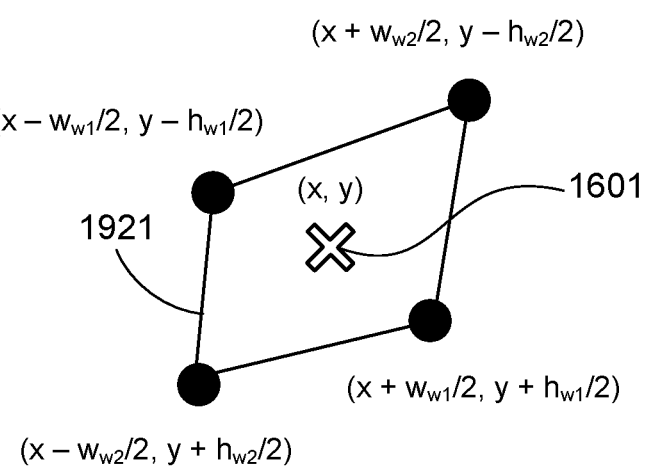
FIG. 19B shows an example determining a portion of a captured calibration pattern using an additional calibration pattern in an additional offset direction.

After capturing and subtracting images of the second calibration patterns, an additional local shift and scale in the second offset direction can be determined. FIG. 19B shows calculations of the width and height of the un-warped portion using both the first offset direction and the second offset direction. Two sets of width and height are determined. The determined two sets are used to determine the vertices of a more complicated portion 1921 centred on the sampling position 1601 which, when un-warped to the un-warped portion 1701, may be decoded more successfully than with a single projection offset.

In other arrangements, the calibration pattern is offset in more directions than the two described above. For extremely curved surfaces, for example, offsetting the calibration pattern in more than 2 directions can have an advantage of allowing more precise unwarping. Each additional offset direction allows a local scale to be calculated along a different direction in the captured image, which allows additional portion vertices to be positioned. The additional vertices provide for a more complex unwarping process (e.g. using a warp map) that is more appropriate for extremely curved surfaces.

In yet further arrangements, the calibration pattern may be offset in a direction that varies over time. For example, a calibration pattern offset direction may be randomly chosen, or may be selected from a finite set of possible offset directions. Another example involves determining a calibration pattern offset direction using knowledge of vertex positions determined from one or more prior, recent measurements of offset and scale.

In a further arrangement, to gain additional accuracy, the locations of the vertices of the warped portion are determined using at least one additional local offset and scale at additional spatial locations surrounding the sampling position. At the additional locations, windows within the non-offset calibration pattern and offset calibration pattern are again used to measure the spatial capture offset. The measured spatial capture offset is compared with the projection offset to determine the additional scale. The additional scale is used to determine the vertices of the warped portion, and subsequently to de-warp the portion. Preferably, the additional locations are the locations of the vertices determined using the original scale.

Figure 20:
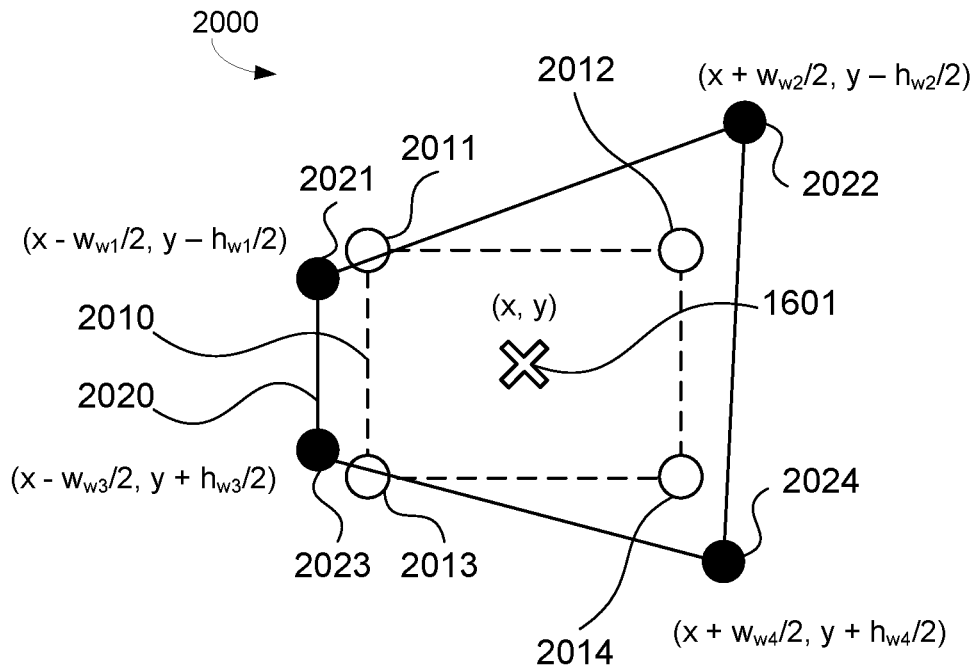
FIG. 20 shows an example of determining additional offsets and scales at approximate positions.

FIG. 20 shows an example 2000 of using additional offset and scale measurements to determine a more accurate warped portion of a calibration pattern.

The example 2000 includes vertices 2011-2014 of a first warped portion 2010 are determined using the offset and scale measured at the sample position 1601. The vertices 2011-2014 form an approximation of the warped portion. The locations of the vertices 2011-2014 are determined as described with respect to FIG. 17A. For example, the offset and scale are measured at the positions of vertices 2011-2014. The measurement produces a separate offset and scale for each of the vertices 2011-2014. The offset and scale are measured using a region of the calibration pattern that is closer to the positions of the vertices 2011-2014. FIG. 20 also shows positions of refined vertices 2021-2024, determined using the offset and scale determined at the vertices 2011-2014. The scale in the x- and y-direction for the vertices 2021, 2022, 2023 and 2024 are shown as ($scale_{x1}$, $scale_{y1}$), ($scale_{x2}$, $scale_{y2}$), ($scale_{x3}$, $scale_{y3}$) and ($scale_{x4}$, $scale_{y4}$), respectively. A separate scale for each vertex is used to calculate a separate width and height for each vertex, as shown in FIG. 20. A resulting portion 2020 potentially better resembles the warping caused during projection and capture and, when un-warped to the un-warped portion 1701 (FIG. 17A), may be decoded successfully. Arrangements comprising determining offset and scale at additional positions can also be combined with arrangements of projecting a calibration pattern that is offset in an orthogonal direction (described with reference to FIG. 19). A preferred implementation determines four vertices of a warped portion of a calibration pattern. Determining four vertices of the warped portion establishes a warped portion that is a quadrilateral. In some scenarios, where there is a large amount of warping (e.g. when the surface is very curved), determining a more accurate warped portion can be beneficial. For example, several offsets and scales can be determined, at positions surrounding the sampling position, to form a general polygon. The region defined by the polygon's vertices can be transformed to the un-warped portion, and be decoded. In other implementations, a more general warp map can be constructed, which maps individual pixels or regions of the captured calibration pattern to the un-warped portion.

In a preferred arrangement, each projected frame contains a non-offset calibration pattern and an offset calibration pattern. If the non-offset calibration pattern is negative, the offset calibration pattern is positive, and vice-versa. The preferred arrangement allows the pattern decoder module 603 to isolate the offset and non-offset calibration patterns using image subtraction. Local offsets can be determined using correlation and, more specifically, cross-correlation. In other arrangements, the calibration patterns in a single frame are both either negative or positive. In the arrangement, a subtracted frame will contain both non-offset and offset calibration patterns, and the local offset can be determined using auto-correlation, which is well known in the art.

Alternatively, non-offset and offset calibration patterns can be completely separated, being projected in separate frames. For example, a first projected frame may consist of a negative non-offset calibration pattern, a second projected frame may consist of a positive non-offset calibration pattern, a third projected frame may consist of a negative offset calibration pattern, and a fourth projected frame may consist of a positive offset calibration pattern. In other implementations, in which additional offset directions are used (as described with reference to FIG. 19), more than two calibration patterns can be rendered to a single frame, or spread over multiple frames in various configurations. The person skilled in the art will appreciate that various other methods of projecting non-offset and offset calibration patterns may be used.

In the preferred arrangement, calibration pattern un-warping is used to establish correspondences between a projector and a camera, for purposes of aligning multiple projectors on a projection surface. For example, the arrangements described may be implemented when a projector system is initiated or turned on, or when calibration of a projector system is requested by a user, e.g., by manipulating an input of the computer module 101 or an input of one of the projectors 181 and 182. The projectors 181 and 182 can accordingly be aligned to reproduce visual content with decreased distortion. Additionally or alternatively, the arrangements described may be implemented periodically during use of the projection system 100, for example every time a content image to be projected is changed, or at predetermined time intervals, and the projectors 181 and 182 re-aligned if required.

Alternatively, correspondences between two cameras can be formed. The arrangements described can also be used in other applications, such as 3D scanning, projection mapping, augmented reality, etc. More generally, the arrangements relate to a method of un-warping a warped calibration pattern to reproduce visual content with decreased distortion or warping.

The arrangements described are applicable to the computer and data processing industries and particularly for image processing and projection industries.

The foregoing describes only some embodiments of the present invention, and modifications and/or changes can be made thereto without departing from the scope and spirit of the invention, the embodiments being illustrative and not restrictive. For example, one or more of the features of the various arrangements described above may be combined, or some steps of the arrangements described may be re-ordered.

The invention claimed is:

1. A computer-implemented method of reproducing visual content, the method comprising:
   capturing a reference image of a calibration pattern projected on a surface at an initial position and at an offset position, the offset position relating to a projection offset from the initial position by shifting the calibration pattern a predetermined amount;
   determining, using the reference image, a spatial capture offset for the calibration pattern between the initial position and the offset position, the spatial capture offset measuring a spatial shift of the calibration pattern in the reference image;
   determining a scale using the spatial capture offset and the projection offset;
   decoding a portion of a captured image, the captured image including the visual content and the calibration pattern, to determine a position within the calibration pattern by applying the determined scale, and
   reproducing the visual content based on the determined position.

2. The method according to claim 1, wherein reproducing the visual content comprises aligning projection of a plurality of projectors.

3. The method according to claim 1, wherein the captured image is the reference image.

4. The method of claim 1, wherein the captured image is a different image to the reference image.

5. The method according to claim 1 wherein the decoding comprises the steps of:
   applying the determined scale to a portion of the captured image to de-warp the portion of the image; and
   decoding the de-warped portion of the captured image to determine the position within the calibration pattern.

6. The method according to claim 1, wherein the decoding comprises applying the determined scale to a corresponding portion of a projected image to warp a portion of the projected image to match the portion of the captured image; and
   correlating the portions to determine the position within the captured image.

7. The method according to claim 1 wherein the determined position within the calibration pattern is used to form a correspondence between a position in the captured image and a position in the calibration pattern.

8. The method according to claim 1 wherein determining the spatial capture offset further comprises:
   extracting a non-offset window of a non-offset projection of the calibration pattern;
   extracting an offset window of an offset projection of the calibration pattern; and
   correlating the extracted non-offset window with the extracted offset window to determine the spatial capture offset.

9. The method according to claim 1 wherein determining the scale further comprises calculating a ratio of the spatial capture offset to the projection offset.

10. The method according to claim 1 wherein applying the determined scale to the portion of the captured image further comprises:
    determining a scale in each of a first direction and a second direction, the first and second directions being different;
    determining a width and height of the portion of the image using the determined scales; and
    locating a vertex of the portion of the captured image using the determined width and height.

11. The method according to claim 1 wherein the decoding comprises the steps of:
    applying the determined scale to a portion of the captured image to de-warp the portion of the image; and
    decoding the de-warped portion of the captured image to determine the position within the calibration pattern; and wherein
    decoding the de-warped portion of the captured image further comprises correlating the de-warped portion with one or more pseudo-random dot patterns of the calibration pattern.

12. The method according to claim 1 wherein:
    capturing the reference image comprises capturing two images, each image containing a non-offset calibration pattern and an offset calibration pattern; and wherein
    determining the spatial capture offset comprises:
       extracting a non-offset calibration pattern by subtracting a first one of the two images from the second image;
       extracting an offset calibration pattern by subtracting the second of the two images from the first image; and
    comparing the non-offset calibration pattern and the offset calibration pattern to determine the spatial capture offset.

13. The method according to claim 1 further comprising:
    capturing a further image of the calibration pattern projected on the surface at an additional offset position, the additional offset position having an additional projection offset from the initial position by shifting the calibration pattern a predetermined amount in a direction different to the projection offset;
    determining an additional spatial capture offset for the calibration pattern between the initial position and the additional offset position;
    determining an additional scale from the additional spatial capture offset and the additional projection offset; and
    applying the determined scale and the determined additional scale to the portion of the captured image to de-warp the portion of the captured image.

14. The method according to claim 1 further comprising:
    determining an additional scale from the spatial capture offset and the projection offset, the additional scale being measured at a spatial location in the reference image, the spatial location being different to the determined location; and
    applying the determined scales to a portion of the captured image to de-warp the portion of the captured image.

15. The method of claim 1, wherein reproducing the visual content comprises projection of the visual content.

16. A non-transitory computer readable medium having a program stored thereon for calibrating reproduction visual content, the program comprising:
    code for capturing a reference image of a calibration pattern projected on a surface at an initial position and at an offset position, the offset position relating to a projection offset from the initial position by shifting the calibration pattern a predetermined amount;
    code for determining, using the reference image, a spatial capture offset for the calibration pattern between the initial position and the offset position, the spatial capture offset measuring a spatial shift of the calibration pattern in the reference image;

code for determining a scale using the spatial capture offset and the projection offset;

code for decoding a portion of a captured image, the captured image including the visual content and the calibration pattern, to determine a position within the calibration pattern by applying the determined scale, and code for calibrating reproduction of the visual content based on the determined position.

17. Apparatus for reproducing visual content, the apparatus configured to:

capture a reference image of a calibration pattern projected on a surface at an initial position and at an offset position, the offset position relating to a projection offset from the initial position by shifting the calibration pattern a predetermined amount;

determine, using the reference image, a spatial capture offset for the calibration pattern between the initial position and the offset position, the spatial capture offset measuring a spatial shift of the calibration pattern in the reference image;

determine a scale using the spatial capture offset and the projection offset;

decode a portion of a captured image, the captured image including the visual content and the calibration pattern, to determine a position within the calibration pattern by applying the determined scale, and reproduce the visual content based on the determined position.

18. A system comprising:

a plurality of projectors;

an image capture device configured to capture an image of a projection surface; and a memory for storing data and a non-transitory computer readable medium; and a processor coupled to the memory for executing a computer program, the processor in communication with the image capture device and the plurality of projectors via a network, the program having instructions for:

receiving, from the image capture device, a first image of a calibration pattern projected on the projection surface by the plurality of projectors at an initial position;

receiving, from the image capture device, a second image of the calibration pattern projected on the projection surface by the plurality of projectors at an offset position, the offset position relating to a projection offset from the initial position by shifting the calibration pattern a predetermined amount;

determining, using the captured images, a spatial capture offset for the calibration pattern between the initial position and the offset position, the spatial capture offset measuring a spatial shift of the calibration pattern between the first and second images;

determining a scale using the spatial capture offset and the projection offset;

decoding a portion of a captured image received from the image capture device, the captured image including visual content and the calibration pattern, to determine a position within the calibration pattern by applying the determined scale, and reproducing the visual content based on the determined position using the plurality of projectors.

19. A computer-implemented method of aligning projection, the method comprising:

receiving a captured image obtained by capturing a reference image of a calibration pattern projected on a surface at an initial position and at an offset position, the offset position relating to a projection offset from the initial position by shifting the calibration pattern a predetermined amount;

determining, using the reference image, a spatial capture offset for the calibration pattern between the initial position and the offset position, the spatial capture offset measuring a spatial shift of the calibration pattern in the reference image;

determining a parameter using the spatial capture offset and the projection offset, the parameter relating to a relationship between distance in the captured image and distance in the reference image.

20. An apparatus for aligning projection, the apparatus configured to:

receive a captured image obtained by capturing a reference image of a calibration pattern projected on a surface at an initial position and at an offset position, the offset position relating to a projection offset from the initial position by shifting the calibration pattern a predetermined amount;

determine, using the reference image, a spatial capture offset for the calibration pattern between the initial position and the offset position, the spatial capture offset measuring a spatial shift of the calibration pattern in the reference image;

determine a parameter using the spatial capture offset and the projection offset, the parameter relating to a relationship between distance in the captured image and distance in the reference image.

21. A non-transitory computer readable medium having a program stored thereon for executing a computer-implemented method of aligning projection, the method comprising:

receiving a captured image obtained by capturing a reference image of a calibration pattern projected on a surface at an initial position and at an offset position, the offset position relating to a projection offset from the initial position by shifting the calibration pattern a predetermined amount;

determining, using the reference image, a spatial capture offset for the calibration pattern between the initial position and the offset position, the spatial capture offset measuring a spatial shift of the calibration pattern in the reference image;

determining a parameter using the spatial capture offset and the projection offset, the parameter relating to a relationship between distance in the captured image and distance in the reference image.

* * * * *